(12) United States Patent
Shelnutt et al.

(10) Patent No.: US 9,839,164 B2
(45) Date of Patent: Dec. 5, 2017

(54) RACK INFORMATION HANDLING SYSTEM HAVING MODULAR LIQUID DISTRIBUTION (MLD) CONDUITS

(71) Applicant: DELL PRODUCTS, L.P., Round Rock, TX (US)

(72) Inventors: Austin Michael Shelnutt, Leander, TX (US); Travis C. North, Cedar Park, TX (US); Christopher M. Helberg, Austin, TX (US); Steven Embleton, Austin, TX (US); Edmond I. Bailey, Cedar Park, TX (US); James D. Curlee, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 3 days.

(21) Appl. No.: 15/016,226

(22) Filed: Feb. 4, 2016

(65) Prior Publication Data

US 2017/0181323 A1    Jun. 22, 2017

Related U.S. Application Data

(60) Provisional application No. 62/270,563, filed on Dec. 21, 2015.

(51) Int. Cl.
H05K 7/20 (2006.01)
(52) U.S. Cl.
CPC ..... *H05K 7/20781* (2013.01); *H05K 7/20772* (2013.01)

(58) Field of Classification Search
CPC ........... H05K 7/20781; H05K 7/20218; H05K 7/20254; H05K 7/20272; H05K 7/20281;
(Continued)

(56) References Cited

U.S. PATENT DOCUMENTS 6,775,137 B2    8/2004    Chu et al.
7,013,955 B2    3/2006    Phillips et al.
(Continued)

OTHER PUBLICATIONS

Brown, Robert D., Notice of Allowance, U.S. Appl. No. 15/017,582, The United States Patent and Trademark Office, dated Jun. 13, 2017.
(Continued)

*Primary Examiner* — Anthony Haughton
*Assistant Examiner* — Yahya Ahmad
(74) *Attorney, Agent, or Firm* — Isidore PLLC

(57) ABSTRACT

A direct-interface liquid-cooled (DL) Rack Information Handling System (RIHS) includes liquid cooled (LC) nodes each comprising a chassis received in a respective chassis-receiving bay of a rack and containing heat-generating functional components. Each LC node is configured with a system of conduits to receive direct injection of cooling liquid to regulate the ambient temperature of the node and provide cooling to the functional components inside the node by removing heat generated by the heat-generating functional components. A cooling subsystem has a liquid rail formed by more than one node-to-node, Modular Liquid Distribution (MLD) conduits, each including first and second terminal connections attached on opposite ends of a central conduit that can be rack-unit dimensioned. The MLD conduits seal to and enable fluid transfer between a port of a selected LC node and a port of an adjacent LC node.

21 Claims, 19 Drawing Sheets

(58) Field of Classification Search
CPC ........... H05K 7/20627; H05K 7/20645; H05K 7/20763; H05K 7/20772; H05K 7/20872; H05K 7/20654; H05K 7/2079; G06F 2200/201
USPC ...... 361/679.47–679.53, 699–716; 165/80.4, 165/80.5; 62/259.2
See application file for complete search history.

(56) References Cited

U.S. PATENT DOCUMENTS

| | | | |
|---|---|---|---|
| 7,403,384 B2 | 7/2008 | Pflueger | |
| 8,405,975 B2 | 3/2013 | Helberg et al. | |
| 8,934,244 B2 | 1/2015 | Shelnutt et al. | |
| 2004/0190247 A1 | 9/2004 | Chu et al. | |
| 2005/0248922 A1 | 11/2005 | Chu et al. | |
| 2008/0067805 A1 | 3/2008 | Kamada et al. | |
| 2008/0232064 A1 | 9/2008 | Sato et al. | |
| 2009/0086428 A1 | 4/2009 | Campbell et al. | |
| 2009/0086432 A1 | 4/2009 | Campbell et al. | |
| 2009/0154096 A1 | 6/2009 | Iyengar et al. | |
| 2009/0262501 A1 | 10/2009 | Claassen et al. | |
| 2010/0103614 A1* | 4/2010 | Campbell | H05K 7/20809 361/689 |
| 2010/0103618 A1 | 4/2010 | Campbell et al. | |
| 2013/0106265 A1* | 5/2013 | Shelnutt | H05K 7/20254 312/236 |
| 2013/0112378 A1 | 5/2013 | Shelnutt et al. | |
| 2013/0312839 A1 | 11/2013 | Shelnutt et al. | |
| 2013/0312846 A1 | 11/2013 | Eriksen et al. | |
| 2013/0312854 A1 | 11/2013 | Eriksen et al. | |
| 2014/0202678 A1* | 7/2014 | Goth | H05K 7/20772 165/287 |
| 2014/0203550 A1 | 7/2014 | Utsch | |
| 2014/0218859 A1 | 8/2014 | Shelnutt et al. | |
| 2014/0321056 A1 | 10/2014 | Yoshikawa et al. | |
| 2015/0109735 A1 | 4/2015 | Campbell et al. | |
| 2016/0066480 A1 | 3/2016 | Eckberg et al. | |
| 2016/0242319 A1 | 8/2016 | Edwards et al. | |
| 2016/0366792 A1* | 12/2016 | Smith | G06F 1/20 |
| 2017/0049009 A1* | 2/2017 | Steinke | H05K 7/20736 |

OTHER PUBLICATIONS

Dravininkas, Adam B., Non-Final Office Action, U.S. Appl. No. 15/016,249, The United States Patent and Trademark Office, dated Jun. 20, 2017.

* cited by examiner

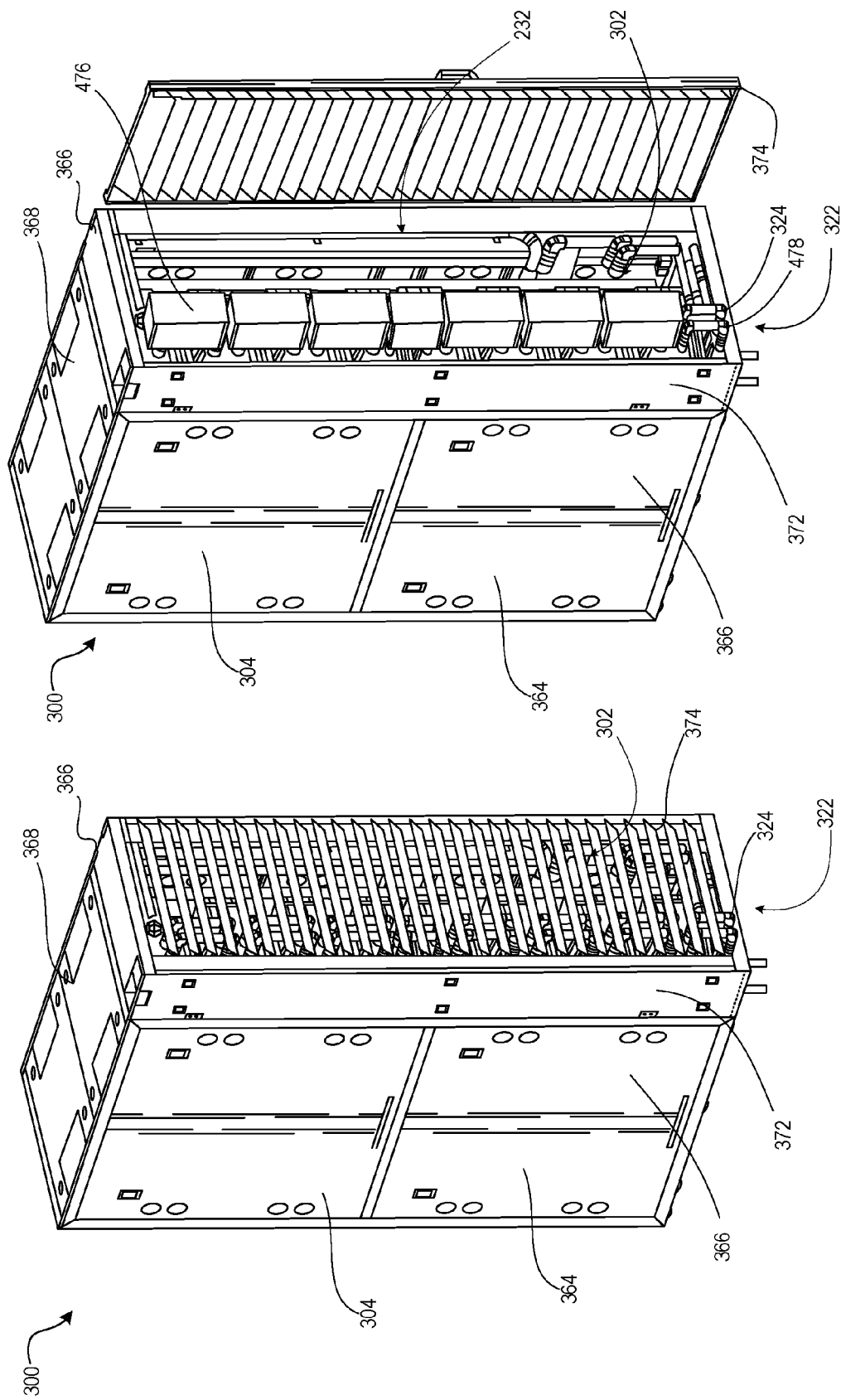

RACK INFORMATION HANDLING SYSTEM HAVING MODULAR LIQUID DISTRIBUTION (MLD) CONDUITS

PRIORITY

The present invention claims priority from Provisional Application Ser. No. 62/270,563, with filing/priority date of Dec. 21, 2015. The entire content of the provisional application is incorporated herein by reference.

BACKGROUND

1. Technical Field

The present disclosure generally relates to information handling systems (IHS), and more particular to a rack-configured IHS, having a liquid cooling subsystem and liquid-cooled nodes. Still more particularly, the disclosure is related to a liquid cooling system having a modular rack liquid distribution network of conduits.

2. Description of the Related Art

As the value and use of information continue to increase, individuals and businesses seek additional ways to process and store information. One option available to users is Information Handling Systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS.

As liquid cooling improves in efficiencies and performance, data center solutions continue to focus on implementing liquid cooling at the rack level. Recently, localized liquid solutions (CPU/GPU cold plates) have been successful in removing most of the heat from these components within a server and into the facility cooling loop through direct fluid-to-fluid heat exchangers (server cooling loop to facility cooling loop) within the rack, but this method does not provide cooling to auxiliary components (such as storage devices (HDDs, memory), or critical secondary ICT equipment, such as top of the rack switch, network switches, battery backup units, or Power Supply Units (PSUs).

BRIEF SUMMARY

The illustrative embodiments of the present disclosure provides a Direct-Interface Liquid-Cooled (DL) Rack Information Handling System (RIHS), a direct-interface liquid cooling subsystem, and a method for modularly providing liquid cooling to information technology (IT) nodes within a RIHS. The IT nodes are liquid cooled (LC) nodes that contain heat-generating functional components, and the nodes can have different form factors and different cooling requirements. In one or more embodiments, the RIHS includes a rack having chassis-receiving bays. Each chassis is received into a respective chassis-receiving bay of the rack. The chassis can be a node enclosure or can be a block chassis that receives more than one node enclosure. Each LC node is configured with a system of conduits to receive direct injection of cooling liquid to regulate the ambient temperature of the node and provide cooling to the components inside the node by absorbing and removing heat generated by the heat-generating functional components. The cooling subsystem has a liquid rail formed by more than one node-to-node, Modular Liquid Distribution (MLD) conduits connecting between LC nodes provisioned in the rack. The MLD conduits comprise first and second terminal connections attached on opposite ends of a central conduit that is rack-unit dimensioned to seal to and enable fluid transfer between a port of a selected LC node and a port of an adjacent LC node.

According to at least one aspect of the present disclosure, a liquid cooling subsystem of a RIHS includes a liquid rail formed by more than one node-to-node, MLD conduits connecting between more than one LC node provisioned in a rack. Each LC node includes a chassis received in a respective chassis-receiving bay of the rack and each LC node contains one or more heat-generating functional components. Each LC node is configured with a system of conduits to receive direct injection of cooling liquid to regulate the ambient temperature of the node and provide cooling to the components inside the node by absorbing and removing heat generated by the heat-generating functional components.

According to at least one aspect of the present disclosure, a method is provided of assembling a DL RIHS that includes mounting a plurality of block liquid manifolds at a back of the rack, where each block liquid manifold has at least one rail supply port and a rail return port on an outside facing side of the block liquid manifold that respectively communicate with at least one block supply port and a block return port on an inside facing side of the block liquid manifold. The method includes inserting more than one LC nodes in receiving bays of the rack corresponding to locations of the mounted block liquid manifolds, with the supply ports and the return ports of the LC nodes and an inside facing portion of the corresponding block liquid manifold linearly aligned. The method includes sealing, for fluid transfer, the ports of a selected one or more LC nodes to the lineally aligned block supply and return ports of the inside facing portion of the block liquid manifold. The method includes attaching node-to-node interconnecting Modular Liquid Distribution (MLD) conduits between a selected pair of adjacent rail supply ports and adjacent rail return ports of the exterior face of the block liquid manifolds to form a supply conduit and a return conduit, respectively, of a scalable liquid rail. The method further includes attaching bypass conduits across the nodes to allow for continued flow of cooling liquid to the remaining nodes in the RIHS following removal of one or more of the MLD conduits serving specific nodes. The assembly enables liquid cooling to the functional components inside the LC nodes. Liquid cooling is provided to the functional components inside the LC nodes via liquid absorption of heat generated by the heat-generating functional components, followed by liquid transfer of the absorbed heat away from the inside of the node.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 3 illustrates a rear perspective view of an example DL RIHS with a louvered rear door in a closed position over uncovered MLD conduits, according to one or more embodiments;

FIGS. 4 and 5 illustrate a rear perspective view of the example DL RIHS of FIG. 3 with the louvered rear door opened to expose node-to-node interconnection of MLD conduits of different vertical sizes having appropriately sized and removable pipe covers, according to one or more embodiments;

DETAILED DESCRIPTION

Figure 1:
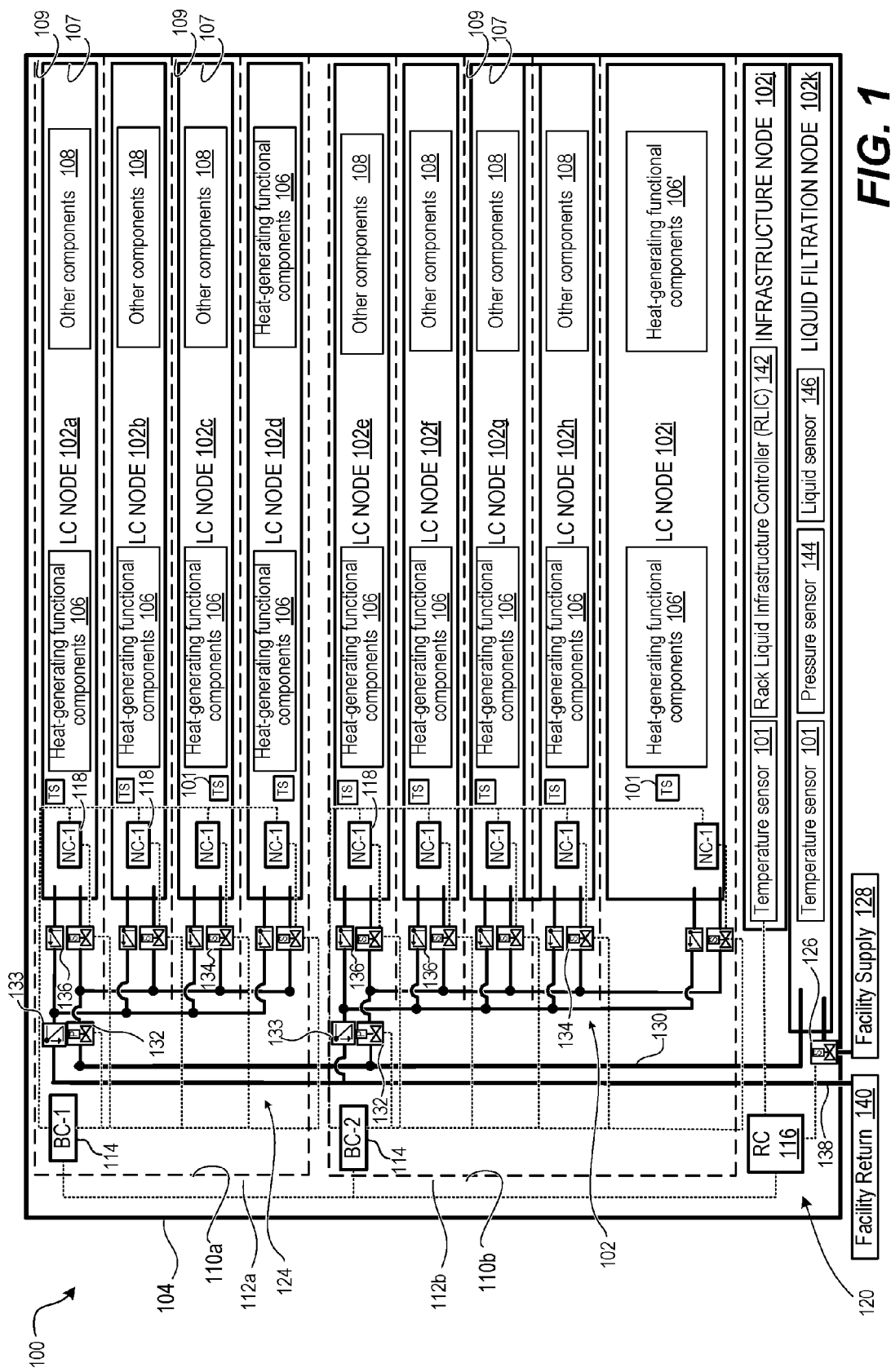
FIG. 1 illustrates a side perspective view of an internal layout/configuration of an example Direct-Interface Liquid-Cooled (DL) RIHS, according to one or more embodiments.

The present disclosure generally provides a Direct-Interface Liquid-Cooled (DL) Rack Information Handling System (RIHS) providing liquid cooled (LC) information technology (IT) nodes containing heat-generating functional components and which are cooled at least in part by a liquid cooling subsystem. The RIHS includes a rack configured with chassis-receiving bays in which is received a respective chassis of one of the LC nodes. Each LC node is configured with a system of conduits to receive direct injection of cooling liquid to regulate the ambient temperature of the node. Additionally, each LC node, configured with a system of conduits, provides cooling to the components inside the node by conductively absorbing, via the cooling liquid, heat generated by the heat-generating functional components. The absorbed heat is removed (or transferred away) from within the node to outside of the node and/or the RIHS. The cooling subsystem has a liquid rail formed by more than one node-to-node, Modular Liquid Distribution (MLD) conduit, which include first and second terminal connections attached on opposite ends of a central conduit. The MLD conduits are rack-unit dimensioned to seal to and enable fluid transfer between a port of a selected LC node and a port of an adjacent LC node.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspect of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks. The present disclosure addresses and overcomes the challenges with distributing liquid cooling fluids throughout an IT rack having nodes with a large number of variations in distribution components.

The disclosure also includes the additional consideration that in addition to cooling the primary heat generating components of the rack, such as the processor, what is needed is a way to allow for cooling of secondary equipment within the rack, as well as auxiliary components that would further support utilizing the advantages of a fluid-to-fluid heat exchanger methodology. Additionally, the present disclosure provides a modular approach to utilizing an air-to-liquid heat exchanger with quick connection and scalability to allow the solution to be scalable in both 1U and 2U increments.

FIG. 1 illustrates a side perspective view of an internal layout/configuration of an example Direct-Interface Liquid-Cooled (DL) RIHS 100 configured with a plurality of LC nodes 102, according to one or more embodiments. For simplicity, the example DL RIHS presented in the various illustrations can be described herein as simply RIHS 100; however, references to RIHS 100 are understood to refer to a DL RIHS, with the associated liquid cooling infrastructure and/or subsystems and supported LC nodes 102. RIHS 100 includes rack 104, which comprises a rack frame and side panels, creating a front-to-back cabinet within which a plurality of chassis receiving bays are vertically arranged and in which a chassis of a respective IT node 102 can be inserted. Rack 104 includes certain physical support structures (not specifically shown) that support IT gear insertion at each node location. Additional description of the structural make-up of an example rack is provided in the description of FIGS. 2-4, which follows.

FIG. 1 depicts an illustrative example of LC nodes 102a-102j (collectively refer to as nodes 102), with each nodes 102a-102i including heat-generating functional components 106. Additionally, RIHS 100 also includes an infrastructure node 102j and liquid filtration node 102k, which do not necessarily include heat-generating functional components 106 that require liquid cooling, as the other LC nodes 102a-102i. In the illustrative embodiments, nodes 102a-102b, and 102e-102h include other components 108 that are not necessarily heat generating, but which are exposed to the same ambient heat conditions as the heat generating components by virtue of their location within the node. In one embodiment, these other components 108 can be sufficiently cooled by the direct injection of cooling liquid applied to the node and/or using forced or convective air movement, as described later herein. Each node 102 is supported and protected by a respective node enclosure 107. Nodes 102a-102d are further received in node receiving bays 109 of a first block chassis 110a of a first block 112a. Nodes 102e-102i are received in a second block chassis 110 of a second block 112b. In the illustrative embodiments, the nodes 102 are vertically arranged. In one or more alternate embodiments, at least portions of the nodes 102 (and potentially all of the nodes) may also be arranged horizontally while benefiting from aspects of the present innovation.

The present innovation is not limited to any specific number or configuration of nodes 102 or blocks 112 in a rack 104. According to one aspect, nodes 102 can be of different physical heights of form factors (e.g., 1U, 1.5U, 2U), and the described features can also be applied to nodes 102 having different widths and depths (into the rack), with some extensions made and/or lateral modifications to the placement of cooling subsystem conduits, as needed to accommodate the different physical dimensions. As a specific example, node 102i is depicted as having a larger node enclosure 107' (with corresponding different dimensions of heat-generating functional components 106') of a different number of rack units in physical height (e.g., 2U) that differs from the heights (e.g., 1U) of the other nodes 102a-102h and 102j-102k. RIHS 100 can include blocks 112 or nodes 102 selectably of a range of discrete rack units. Also, different types of IT components can be provided within each node 102, with each node possibly performing different functions within RIHS 100. Thus, for example, a given node 102 may include one of a server module, a power module, a control module, or a storage module. In a simplest configuration, the nodes 102 can be individual nodes operating independent of each other, with the RIHS 100 including at least one rack-level controller (RC) 116 for controlling operational conditions within the RIHS 100, such as temperature, power consumption, communication, and the like. Each node 102 is then equipped with a node-level controller (NC) 118 that communicates with the rack-level controller 116 to provide localized control of the operational conditions of the node 102. In the more standard configuration of a DL RIHS 100, and in line with the described embodiments, RIHS 100 also includes block-level controllers (BCs) 114, communicatively coupled to the rack-level controller 116 and performing block-level control functions for the LC nodes within the specific block. In this configuration, the nodes 102 are arranged into blocks 112, with each block 112 having one or more nodes 102 and a corresponding block-level controller 114. Note the blocks do not necessarily include the same number of nodes, and a block can include a single node, in some implementations.

A Direct-Interface Liquid Cooling (DL) subsystem (generally shown as being within the RIHS and labelled herein as 120) provides liquid cooling to heat-generating functional components 106 via a liquid rail 124 under the control of the rack-level controller 116, block-level controllers 114, and/or node-level controllers 118, in some embodiments. Rack-level controller 116 controls a supply valve 126, such as a solenoid valve, to allow cooling liquid, such as water, to be received from a facility supply 128. The cooling liquid is received from facility supply 128 and is passed through liquid filtration node 102l before being passed through supply conduit 130 of liquid rail 124. Each block 112a, 112b receives a dynamically controlled amount of the cooling liquid via block-level dynamic control valve 132, such as a proportional valve. Return flow from each block 112a, 112b can be protected from backflow by a block check valve 133. The individual needs of the respective nodes 102a-102d of block 112a can be dynamically provided by respective node-level dynamic control valves 134, controlled by the block-level controller 114, which control can, in some embodiments, be facilitated by the node-level controllers 118. In addition to allocating cooling liquid in accordance with cooling requirements (which can be optimized for considerations such as performance and economy), each of the supply valve 126 and/or dynamic control valves 132, 134 can be individually closed to mitigate a leak. A check valve 136 is provided between each node 102a-102j and a return conduit 138 of the liquid rail 124 to prevent a backflow into the nodes 102a-102j. The return conduit 138 returns the cooling liquid to a facility return 140.

To support the temperature control aspects of the overall system, RIHS 100 includes temperature sensors 101 that are each located within or proximate to each node 102a-102j, with each gauge 101 connected to the node-level controller 118 and/or the corresponding block-level controller 114. Temperature sensors 101 operate in a feedback control loop of the liquid cooling system 122 to control the amount of liquid flow required to cool the nodes 102a-102j. In one or more embodiments, the rack-level controller 116 can coordinate performance constraints to block-level controllers 114 and/or node-level controllers 118 that limit an amount of heat generated by the heat-generating functional components 106 to match a heat capacity of the flow of cooling liquid in DL subsystem 122. Alternatively or in addition, the rack-level controller 116 can coordinate cooling levels to block-level controllers 114 and/or node-level controllers 118 that in turn control the dynamic control valves 132, 134 for absorption and transfer of the heat generated by the heat-generating functional components 106 by the DL subsystem 122. In one or more embodiments, support controllers such as a Rack Liquid Infrastructure Controller (RLIC) 142 can perform management and operational testing of DL subsystem 122. RLIC 142 can monitor pressure sensors 144 and liquid sensors 146 to detect a leak, to validate operation of a namic control valves 132, 134 or shut-off valves such as supply valve 126. RLIC 142 can perform close-loop control of specific flow rates within the RIHS 100.

Figure 2:
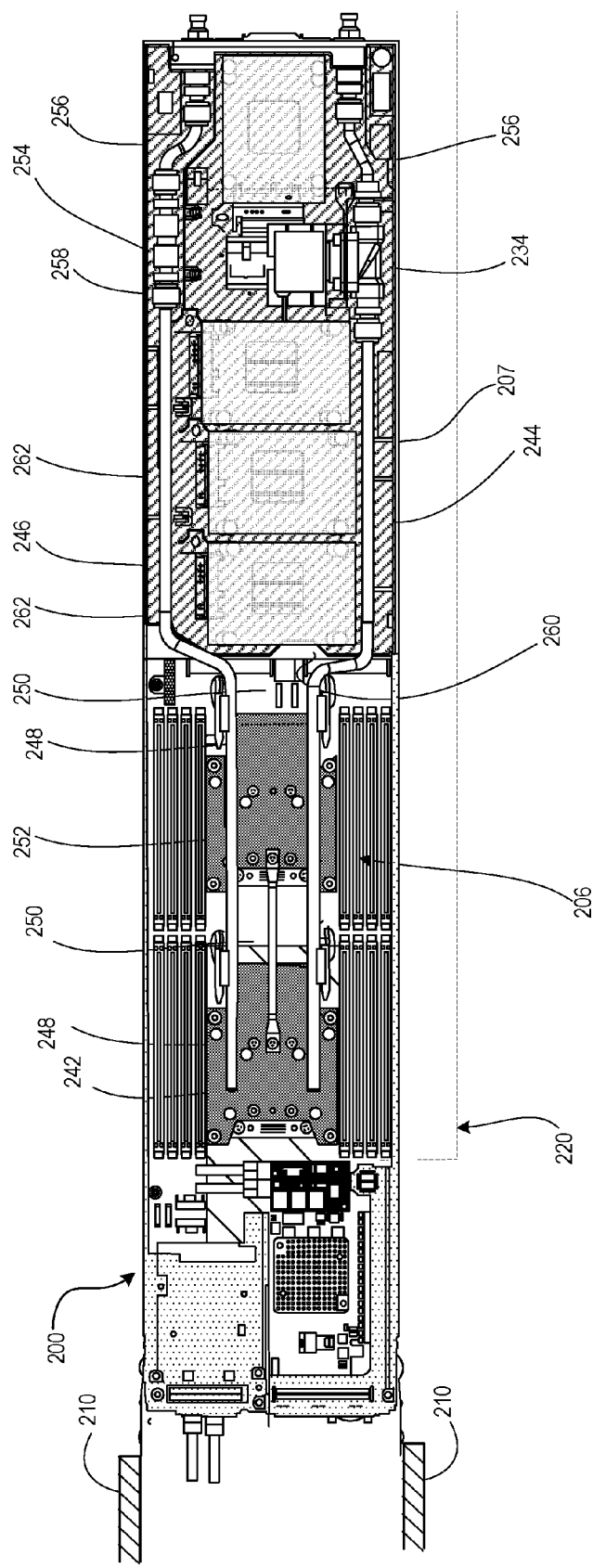
FIG. 2 illustrates a top view of an example LC node configured with a liquid cooling subsystem that includes a liquid-to-liquid manifold and cooling pipes for conductively cooling internal functional components, according to one or more embodiments.

FIG. 2 illustrates example LC node 200 of example DL RIHS 100 of FIG. 1 having a node enclosure 208 insertable into a block chassis 210. For purposes of description, node 200 is a server IHS that includes processing components or central processing units (CPUs), storage devices, and other components. LC node 200 includes cooling subsystem (generally shown and represented as 220) that includes a liquid-to-liquid manifold 242 to cool heat-generating functional components 206 by heat transfer from liquid provided by node-level supply conduit 244, and return conduit 246, according to one or more embodiments. Node-level supply conduit 244 and return conduit 246 are appropriately sized and architecturally placed relative to the other components and the dimensionality (i.e., width, height, and depth/length) of LC node 200 to permit sufficient cooling liquid to pass through the interior of LC the node 200 to remove the required amount of heat from LC node 200 in order to provide appropriate operating conditions (in terms of temperature) for the functional components located within LC node 200. Liquid-to-liquid manifold 242 can include CPU cold plates 248 and voltage regulator cold plates 250. A sled assembly grab handle 252 can be attached between CPU cold plates 248 for lifting LC node 200 out of block chassis 210. A return-side check valve 254 of the return conduit 246 can prevent facility water from back-feeding into LC node 200 such as during a leak event. Flex hose links 256 in each of node-level supply conduit 244 and return conduits 246 can reduce insertion force for sleds into block chassis 210. Sled emergency shutoff device 234 interposed in the supply conduit 244 can be a solenoid valve that closes in response to input from a hardware circuit during a sled-level leak detection event. Node-level carrier 258 received in node enclosure 208 can incorporate liquid containment structure 260 to protect storage device 262. In the illustrative example illustrated by FIG. 2, LC node 200 is oriented horizontally and is viewed from above. In one or more embodiments node-level carrier 258 is configured to route leaked cooling liquid away from storage device 262 when oriented vertically.

FIGS. 3-7 illustrate different exterior and rear views of an example assembled DL RIHS 300. DL RIHS 300 includes rack 304, which is a physical support structure having an exterior frame and attached side panels to create cabinet enclosure 364 providing interior chassis receiving bays (not shown) within which a plurality of individual node chasses (or sleds) 208 of functional IT nodes, such as LC node 200 of FIG. 2, are received. In the description of the figures, similar features introduced in an earlier figure are not necessarily described again in the description of the later figures.

Figure 5:
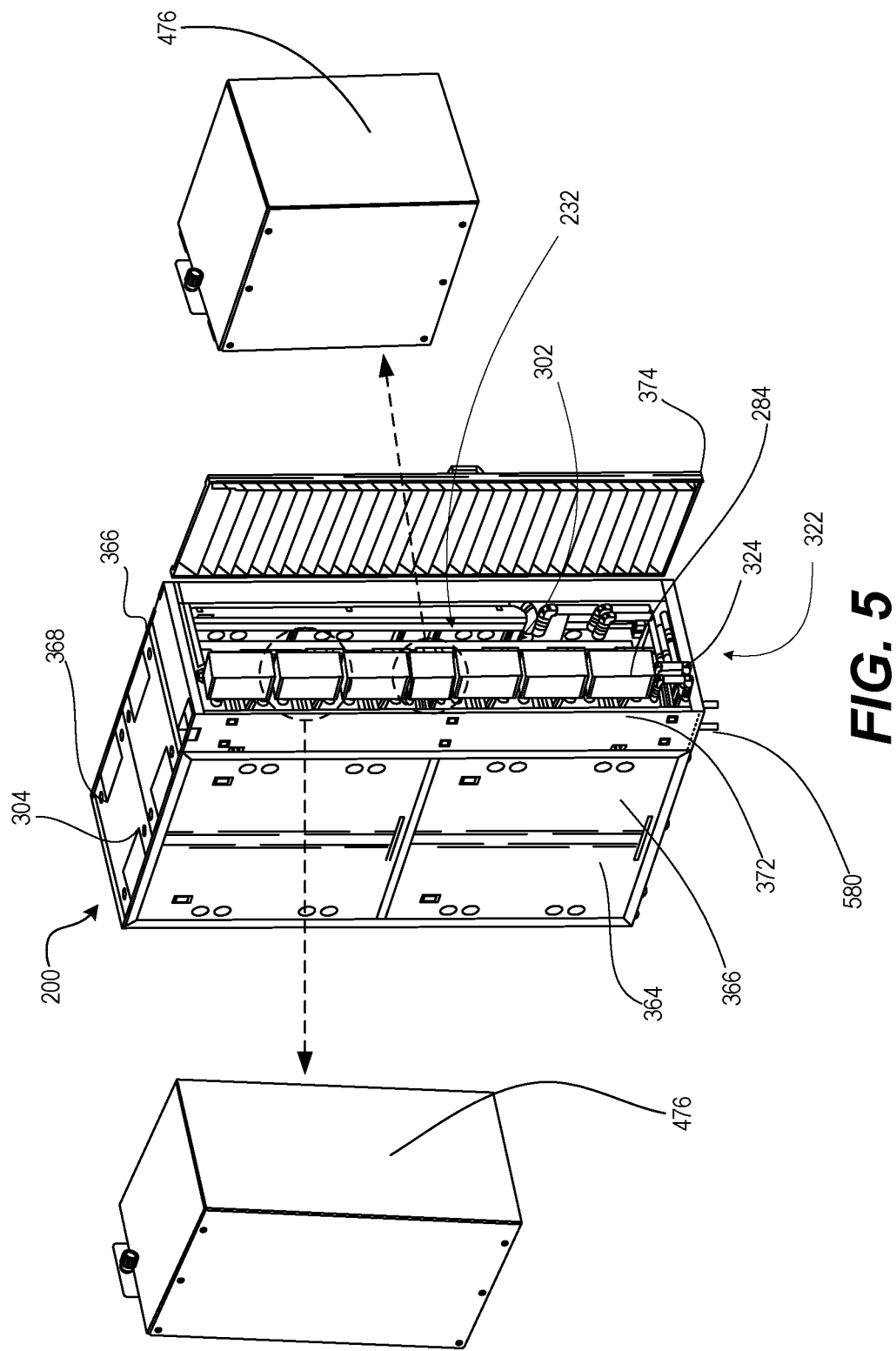

FIGS. 3-5 specifically illustrate exterior views of rack 304 of example DL RIHS 100. As illustrated, rack 304 includes opposing side panels 366, attached to a top panel 368 (and bottom panel—not shown) to create the main cabinet enclosure 364 that includes multiple chassis receiving bays for housing LC nodes 102/200. The created cabinet enclosure 364 includes a front access side (not shown) and a rear side. The front access side provides access to the chassis receiving bays created within the main cabinet enclosure 364 for receiving LC nodes 102 (of FIG. 1) into rack 304. Attached to the rear ends of the main opposing side panels 366 are opposing side panel extensions 372. A louvered rear door 374 is hinged (or otherwise attached) to one of the side panel extensions 372 and includes a latching mechanism for holding the door 374 in a closed position, where in a closed position is relative to the otherwise open space extending laterally between opposing side panel extensions 372. Side panel extensions 372 and louvered rear door 374 provide an extension to main cabinet enclosure 364 for housing, covering/protecting, and providing access to the modular, scalable liquid rail 324 of a liquid cooling subsystem 322 that provides liquid cooling to each LC node 102 (of FIG. 1) inserted into the chassis of the main cabinet enclosure 364.

FIG. 4 illustrates an embodiment in which rear pipe covers 476 can protect portions of liquid rail 324 (of FIG. 3), and specifically Modular Liquid Distribution (MLD) conduits 478, from inadvertent damage as well as containing any leaks from being directed at sensitive functional components 106 (of FIG. 1).

Illustrated in FIG. 5 are rear pipe covers 476 (of FIG. 4) of MLD conduits 478 (of FIG. 4) of liquid rail 324 (of FIG. 3) having different sizes. According to one aspect, the MLD conduits 478 (of FIG. 4) are rack unit dimensioned pipes that form a node-to-node scalable rack liquid manifold ("liquid rail") to distribute cooling liquid, as required, for each node 102 (of FIG. 1) and through the vertical arrangement of nodes 102 (of FIG. 1) within RIHS 100 (of FIG. 1). In an exemplary embodiment, the cooling liquid is received from a facility supply 128 (of FIG. 1) via below rack (e.g. ground level or below floor) connections 580.

Figure 6:
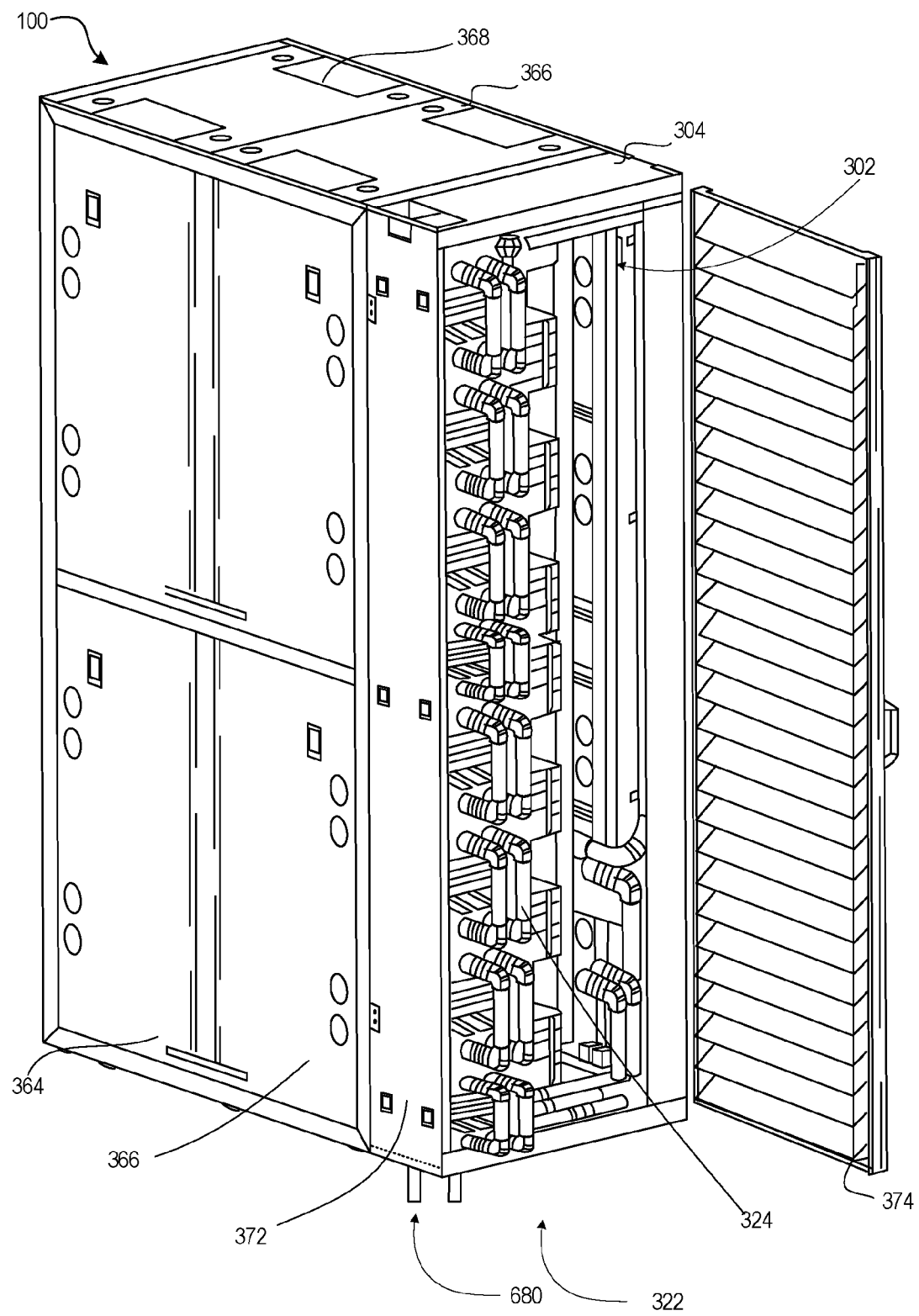
FIG. 6 illustrates the rear perspective view of FIGS. 4-5 with the pipe covers removed to expose the MLD conduits, according to one or more embodiments.

FIG. 6 illustrates an example RIHS 100, as depicted in FIG. 1, with MLD conduits 478 (of FIG. 4), that are uncovered, displaying liquid rail 324 (of FIG. 3). In the embodiment of FIG. 6, cooling liquid is received from a facility supply 128 (FIG. 1) by below rack (e.g. ground level or below floor) connections 680.

Figure 7:
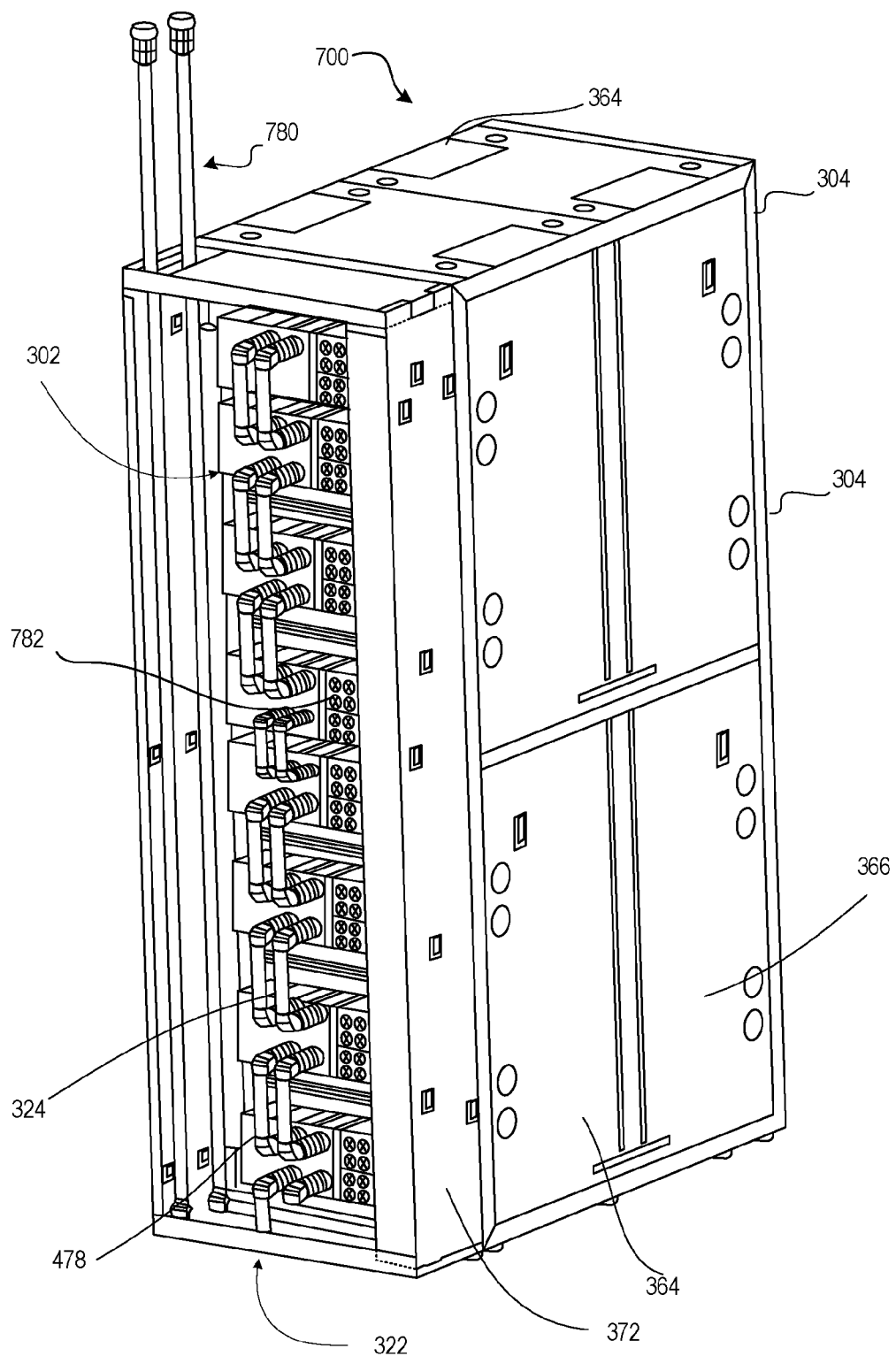
FIG. 7 illustrates a rear perspective view of an example RIHS with MLD conduits in fluid communication with supply side conduits extending from a top of the rack, according to one or more embodiments.

FIG. 7 illustrates a second example RIHS 700, wherein cooling liquid is received from facility supply 128 (FIG. 1) provided by an above-rack (and possibly in ceiling) connections 780. Also shown by FIG. 7 are air movers depicted as fan modules 782 adjacent to the liquid rail. These fan modules 782 are mounted at the back of RIHS 700 to draw air flow through LC nodes 102 providing additional cooling of LC nodes 102, of FIG. 1, (e.g., convection cooling for node components 106, of FIG. 1) that may or may not also receive direct-interface of cooling liquid, in different embodiments.

Figure 8:
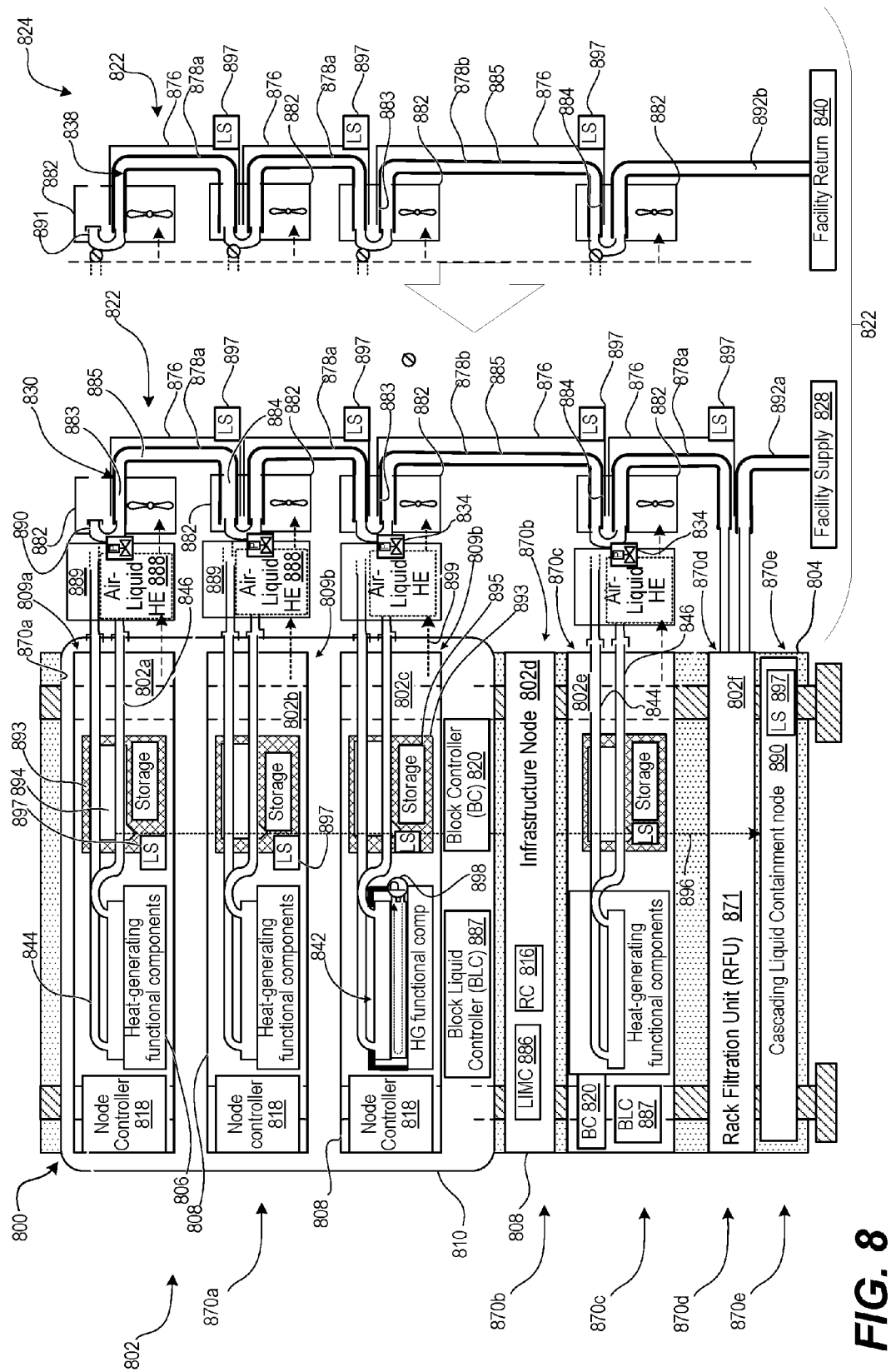
FIG. 8 illustrates a detailed block diagram of a DL RIHS configured with LC nodes arranged in blocks and which are cooled in part by a liquid cooling system having a rail comprised of MLD conduits, and in part by a subsystem of air-liquid heat exchangers, according to multiple embodiments.

FIG. 8 illustrates a more detailed view of the interconnections of the liquid cooling subsystem, at a node level and rack level within an example DL RIHS 800. As shown, RIHS 800 is configured with LC nodes 802a-802e arranged in blocks (e.g., block 1 comprising 802a-802c) and which are cooled in part by a liquid cooling system having a liquid rail comprised of MLD conduits, and in part by a subsystem of air-liquid heat exchangers, can be configured with heat-generating functional components 806 and that are cooled at least in part by a system of MLD conduits 878a-878b, according to one or more embodiments. Illustrated within nodes 802 are heat-generating functional components 806, such as processors, voltage regulators, etc., which emit heat during operation and or when power is applied to the component, such that the ambient temperature increases around the component, and within the node, and eventually within the block, and ultimately DL RIHS 800, during standard operation. To mitigate heat dissipation (and effects thereof), and to maintain the RIHS, block, node, and functional components within proper operating temperatures, DL RIHS 800 is configured with a DL subsystem 822. DL subsystem 822 includes a rack level network of liquid propagating pipes, or conduits that are in fluid communication with individual node level networks of liquid propagating conduits. Additionally, DL subsystem 822 collectively facilitates heat absorption and removal at the component level, the node level, the block level, and/or the rack level. The rack-level network of conduits includes a modular arrangement of a liquid rail 824 formed by more than one node-to-node MLD conduit 878 *a*-878*b* spanning (or extending) between LC nodes 802 provisioned in rack 804.

At the top position of RIHS 800, a block chassis 810 is received in a block chassis receiving bay 870*a* of rack 804. Within block chassis 810, a first node 802*a* received in a first node receiving bay 809*a* of the rack 804 has a vertical height of one rack unit (1U). A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. A second node 802*b* received in a second node receiving bay 809*b* of the rack 104 (of FIG. 1) has a vertical height of 1U. A third node 802*c* received in a third node receiving bay 809*c* of the rack 804 has a vertical height of 1U. A fourth node 802*d*, infrastructure node 802*b*, is received in a second block chassis receiving bay 870*b* of rack 804 and has a vertical height of 1U. Infrastructure node 802*b* can contain functional components such as a rack-level controller 816. A fifth node 802*e* is received in a third chassis receiving bay 870*c* and has a vertical height of 2U. A sixth node 802*f*, which provides a Rack Filtration Unit (RFU) 871, is received in a fourth block chassis receiving bay 870*d* of the rack 804. Infrastructure node 802 and RFU 871 are examples of nodes 802 that may not require liquid cooling. A cascading liquid containment unit 890 is received in a fifth chassis receiving bay 870*e* and includes liquid sensor 897.

MLD conduits 878*a* of 1U can be used to connect nodes of 1U vertical spacing. Because of the additional 1U separation of LC nodes 802*c* and 802*e* by inclusion of infrastructure node 802*d*, MLD conduit 878*b* between the third and fifth nodes 802*c*-802*d* is dimension 2U to accommodate the increased spacing. MLD conduits 878 *a*-878*b* can thus support different heights (1U to NU) of IT components.

Each MLD conduit 878 *a*-878*b* includes first and second terminal connections 883, 884 attached on opposite ends of central conduit 885 that is rack-unit dimensioned to seal to a port of LC node 802 and enable fluid transfer between a port of a selected LC node 802 and a port of an adjacent LC node 802. In FIG. 8, facility supply 828 and facility return 840 are respectively located at the intake end of liquid rail 824 and the exhaust end of liquid rail 824. The actual location of facility supply 828 and facility return 840 can be reversed. Alternatively, facility supply 828 and facility return 840 can be located above the RIHS 800 or both conduits can be located on opposite sides of the RIHS 800 in alternate embodiments.

Liquid cooling subsystem 822 includes a liquid infrastructure manager controller (LIMC) 886 which is communicatively coupled to block liquid controllers (BLCs) 887 to collectively control the amount of cooling liquid that flows through the RIHS 800 and ultimately through each of the nodes 802 in order to effect a desired amount of liquid cooling at the component level, node level, block level, and rack level. For clarity, LIMC 886 and BLCs 887 are depicted as separate components. In one or more embodiments, the liquid control features of the LIMC 886 and BLCs 887 can be incorporated into one or more of the rack-level controller 816, block-level controllers 820, and the node-level controllers 818. As illustrated in FIG. 1 and previously described, each of the LIMC 886 and BLCs 887 are connected to and respectively control the opening and closing of flow control valves that determine the amount of flow rate applied to each block and to each node within the specific block. During cooling operations, one of LIMC 886 and BLC 887 causes a specific amount of liquid to be directly injected into the intake conduits of the LC node 802, which forces the cooling liquid through the system of conduits within the LC node 802 to the relevant areas and/or functional components/devices inside the nodes 802 to absorb and remove heat away from the inside of the node and/or from around the components within the node.

As another aspect, the present disclosure provides a modular approach to utilizing air-to-liquid heat exchanger 888 with quick connection and is scalable in both 1U and 2U increments. In one or more embodiments, DL cooling subsystem 822 can include a plurality of air-to-liquid (or liquid-to-air) heat exchangers 888 that facilitate the release of some of the heat absorbed by the exhaust liquid to the surrounding atmosphere around the RIHS 100 (of FIG. 1). Air-to-liquid heat exchangers 888 can be integral to block liquid manifold 889 that, along with the MLD conduits 878*a*-878*b*, form scalable liquid rail 824. One aspect of the present disclosure is directed to providing scalable rack-mounted air-to-liquid heat exchanger 888 for targeted heat rejection of rack-mounted equipment to DL cooling subsystem 822. Hot air 899 from auxiliary components, such as storage device 895, would be pushed through the air-to-liquid heat exchanger 888, and the resulting energy would transfer to liquid rail 824 and be rejected to a facility cooling loop, represented by the facility return 840.

RIHS 800 can include variations in LC node 802 that still maintain uniformity in interconnections along liquid rail 824 formed by a chassis-to-chassis modular interconnect system of MLD conduits 878*a*-878*b*. With this scalability feature accomplished using MLD conduits 878*a*-878*b*, cooling subsystem 822 of the RIHS 800 allows each block chassis 810 to be a section of a scalable manifold, referred herein as liquid rail 824, eliminating the need for a rack manifold. The scalability of liquid rail 824 enables flexible configurations to include various permutations of server and switch gear within the same rack (rack 804). MLD conduits 878*a*-878*b* can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 834 into each LC node 802 enables each LC node 802 to engage to block liquid manifold 889. Block chassis 810 or node enclosure 808 of each LC node 102 provides the intake and exhaust conduit connections to engage to respective terminals of MLD conduits 878 *a*-878*b* within the MLD network provided by liquid rail 824. For example, where nodes 802 are designed as sleds, node enclosure 808 would be a sled tray, and each block would then include more than one sled tray received into block chassis 810, forming the extensions of block liquid manifold 889. Alternatively, the node enclosure 808 can be a single node chassis such as one of nodes 802c-802f.

Supply and return bypass tubes 890, 891 of each block liquid manifold 889 are connected by MLD conduits 878a-878b to form supply rail conduit 830 and return rail conduit 838. Due to constraints in the spacing within the figure, the tubing that extends from supply and return bypass tubes 890, 891 are not shown, and the valves are shown as if connected directly to the bypass. FIG. 9 provides a more accurate view of this features of the disclosure, with conduits extended into the respective supply and return valves at each block. Also, for clarity, FIG. 8 illustrates the return rail conduit 838 separately. Liquid rail 824 enables multiple types of devices to be coupled together, each receiving an appropriately controlled portion of cooling liquid capacity. In one embodiment, liquid cooling subsystem 822 is passively pressurized by attaching MLD supply conduit 892a to facility supply 828 and an MLD return conduit 892b to facility return 840. Liquid flow from supply rail conduit 830 to return rail conduit 838 of liquid rail 824 can be controlled based upon factors such as a temperature of the liquid coolant, detected temperature within LC nodes 802, air temperature inside or outside of DL RIHS 800, etc.

In an exemplary embodiment, the scalable rack manifold provided by liquid rail 824 is formed in part by MLD conduits 878 a-878b that run vertically in the back of the RIHS 800 with quick disconnects on the front and rear face of block liquid manifold 889 that allows for IT/infrastructure equipment respectively to be plugged into both front and back sides of the block liquid manifold 889. For example, LC nodes 802, such as server modules, can plug into the front side and fan modules 882 can plug onto the back side of block liquid manifold 889. This also allows for other liquid cooled devices such as LC Power Distribution Units (PDUs) to be plugged into the cooling liquid supply rail conduit 830 and return rail conduit 838 of liquid rail 824. Thereby, a rack hot pluggable cooling interface is created for any rack-mounted equipment.

Cooling subsystem 822 can support an embedded liquid-to-liquid heat exchanger manifold 842, such as in LC node 802c. Node liquid-to-liquid heat exchangers are provided for rejecting heat from one fluid source to a secondary source. One aspect of the present disclosure solves the problems that many shared-infrastructure IT systems (e.g., blade chassis) do not have adequate space to accommodate a liquid-to-liquid heat exchanger. Unlike with generally-known systems that rely upon liquid heat transfer having to exchange heat with an external liquid-to-liquid heat exchanger, the present disclosure enables on-rack liquid-to-liquid heat exchanger that does not require any of the vertical chassis space. Additionally, the present disclosure provides these benefits without requiring a central distribution unit (CDU), which takes up datacenter floor space. One aspect of the present disclosure provides embedded heat exchanger manifold 842 having a common heat transfer plate and a shared bulk header to create a combined liquid distribution manifold that includes a secondary liquid coolant for absorbing heat through the shared bulk header. In particular, the combined embedded heat exchanger manifold 842 rejects heat within shared node enclosure 808 such as node 802c to a secondary liquid coolant. Internal node supply 844 and return conduits 846 of a manifold built on top of a heat exchanger core allow heat transport within manifold 842. In one embodiment, closed system pump 898 can use a first coolant to cool a high thermal energy generating functional component such as a CPU or voltage regulator.

Additionally, the liquid cooling subsystem 822 also includes a filtration system or unit 871, which prevents chemical impurities and particulates from clogging or otherwise damaging the conduits as the fluid passes through the network of conduits. According to one aspect of the disclosure, liquid cooling subsystem 822 provides RFU 871 in fluid connection with the intake pipes from facility supply 828. In at least one embodiment, RFU 871 includes a sequenced arrangement of liquid filters within a full-sized sled that can be removably inserted by an end user into one of the receiving slots of rack 804. In one embodiment, the RFU 871 is located on an infrastructure sled having rack-level controllers and other rack-level functional components. In at least one embodiment, the entirety of the sled is filed with components associated with RFU 871. Thus, it is appreciated that the RFU 871 may occupy the entire area of one vertical slot/position within the chassis. Alternate locations of the RFU 871 can also be provided, in different embodiments, with an ideal location presenting the intake port of the RFU 871 in close proximity to a connection to facility supply 828 to directly receive the facility supply 828 prior to the liquid being passed into the remainder of the conduits of the liquid cooling subsystem 822. It is appreciated that if the system was capable of completing all heat exchange within the rack, then sealing the rack would be feasible and would reduce and/or remove any requirements for filtration and/or allocation of rack space for RFU 871.

Liquid cooled compute systems use the high heat transport capacity of water. However, the disclosure recognizes and addresses the fact that with liquid introduced into an electronic enclosure, there is a potential for leaks that can cause catastrophic system failure. Also, in some instances, a leak can create an electronic short with a resulting exothermal reaction causing permanent damage to the DL RIHS 800. To mitigate such risks, as one design feature, node-level carrier 893 can include a trench/gutter system for use as liquid containment structure 894. In one embodiment, the gutter system can also incorporate an absorbent material that can accumulate sufficient amounts of liquid from small leaks to enable external sensing of the leak. Advantageously, the carrier 893 can also be thermally conductive to serve as a heat sink for components such as storage devices 895. In one embodiment, another leak detection solution that can be incorporated into the LC node 802 involves use of a solenoid to create an event when additional current is applied, due to water pooling around the solenoid. Barriers on carrier 893 can be specifically designed to contain a liquid leak and assist in funneling the liquid through the gutter system. Liquid rail 824 can also be provided with leak containment and detection. In one or more embodiments, removable pipe covers 876 are sized to be mounted around respective MLD conduits 878 a-878b and can include liquid sensors 897 for automatic alerts and shutdown measures.

In one or more embodiments, DL RIHS 800 further incorporates a node-level liquid containment structure 890 with a cascading drain runoff tubing network 896 to a rack-level cascading liquid containment structure 894. In one or more embodiments, the DL RIHS 800 further incorporates leak detection response such as partial or complete automated emergency shutdown. Liquid sensors (LS) 897 at various cascade levels can identify affected portions of DL RIHS 800. Containment and automatic shutoff can address the risks associated with a leak developing in the DL cooling system 822.

Figure 9A:
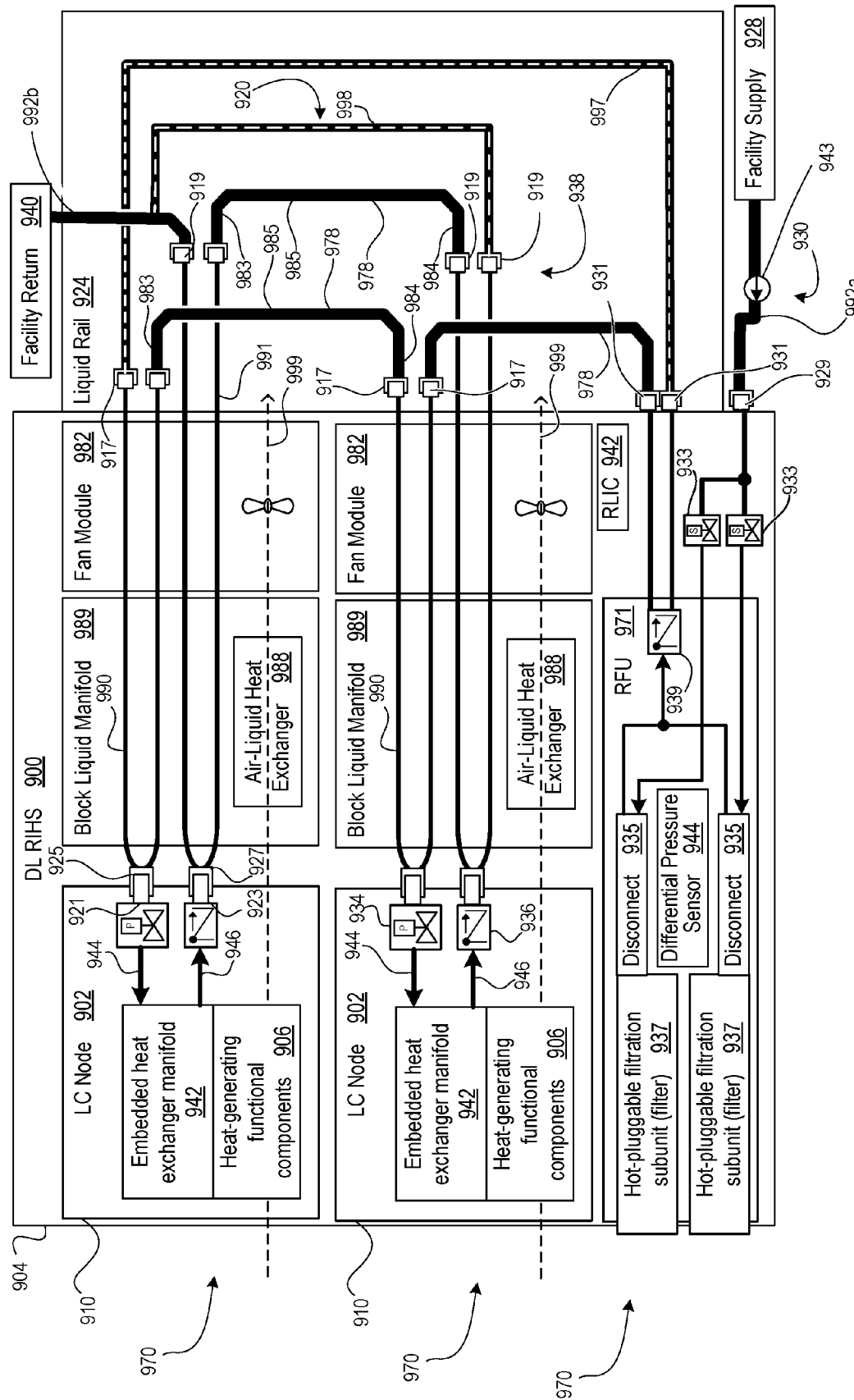
FIG. 9A illustrates an expanded, more detailed view of the liquid interconnection between the node level heat exchange manifold, the block liquid manifold containing the air-liquid heat exchanger, and example MLDs of the liquid rail, according to multiple embodiments.

FIG. 9A illustrates a more detailed view of DL subsystem 920 associated with example DL RIHS 900. Within DL RIHS 900, each LC node 902 includes chassis 910 received in a respective chassis-receiving bay 970 of rack 904. Each LC node 902 contains heat-generating functional components 906. Each LC node 902 is configured with a system of internal supply conduit 944 and return conduit 946, associated with embedded heat exchanger manifold 942. Embedded heat exchanger manifold 942 receives direct injection of cooling liquid to regulate the ambient temperature of LC node 902. A node-level dynamic control valve 934 and node-level return check valve 936 control an amount of normal flow and provide shutoff and/or otherwise mitigate a leak. Cooling subsystem 920 provides cooling to heat-generating functional components 906 inside the LC node 902 by removing heat generated by heat-generating functional components 906. Liquid rail 924 is formed from more than one node-to-node, MLD conduit 978 between more than one LC node 902 within in rack 904. MLD conduits 978 includes first terminal connection 983 and second terminal connection 984. First terminal connection 983 and second terminal connection 984 are attached on opposite ends of central conduit 985. Central conduit 985 is rack-unit dimensioned to directly mate and seal to and enable fluid transfer between a selected pair of rail supply ports 917 and/or rail return ports 919 of a selected LC node 902 and an adjacent LC node 902.

The cooling subsystem 920 includes block liquid manifolds 989 mountable at a back side of the rack 904. Each block liquid manifold has at least one rail supply port 917 and at least one rail return port 919 on an outside facing side of the block liquid manifold 989. The at least one rail supply port 917 and the at least one rail return port 919 respectively communicate with at least one block supply port 921 and a block return port 923 on an inside facing side of the block liquid manifold 989. LC nodes 902 are insertable in receiving bays 970 of rack 904 corresponding to locations of the mounted block liquid manifolds 989. Block supply ports 921 and block return ports 923 of the LC nodes 902 and an inside facing portion of the corresponding block liquid manifold 989 are linearly aligned. The linear alignment enables direct sealing, for fluid transfer, of the lineally aligned inside manifold supply ports 925 and return ports 927 to the inside facing portion of the block liquid manifold 989. In one or more embodiments, block supply port 921 sealed to the internal manifold supply port 925 communicates via supply bypass tube 990 to two rail supply ports 917. Block return port 923 sealed to internal manifold return port 927 communicates via return bypass tube 991 of the respective block liquid manifold 989 to two rail return ports 919. Fan modules 982 mounted respectively onto back of block liquid manifold 989 have apertures to expose rail supply 917 and return ports 919. Additionally, fan modules 982 draw hot air 999 from LC nodes 902 through an air-liquid heat exchanger 988 in block liquid manifold 989.

In one or more embodiments, supply liquid conduit 992a is attached for fluid transfer between facility supply 928 and rail supply port 917 of block liquid manifold 989 of RIHS 900. A return liquid conduit 992b can be attached for fluid transfer between rail return port 919 of block liquid manifold 989 to facility return 940. FIG. 9A further illustrates that the fluid connection to facility supply 928 includes RFU 971. To prevent contamination or damage to cooling subsystem 920, RFU 971 is received in bay 970 of rack 904 and includes input port 929 connected via supply liquid conduit 992a to facility supply 928. The RFU 971 includes output port 931 that is connected to MLD conduit 978 of supply rail conduit 930. Liquid rail 924 also includes return rail conduit 938. RFU 971 controls two external emergency shutoff valves 933 for flow received from the input port 929 that is provided via hot-pluggable disconnects 935 to respective replaceable filtration subunits ("filters") 937. The separation of the intake fluid across dual shutoff valves 933 and filters 937 enables the supply of cooling liquid to continue even when one of the filters is removed or clogged up (preventing the passage of cooling liquid) and/or one of the shutoff valves 933 is closed off. The cooling liquid flows in parallel to two replaceable filtration subunits 937, automatically diverting to the other when one is removed for cleaning or replacement. Thereby, filtration and cooling of RIHS 900 can be continuous even while servicing one of filters 937. Back-flow is prevented by check valve 939 that allows normal flow to exit to output port 931. Differential pressure sensor 944 measures the pressure drop across filters") 937 and provides an electrical signal proportional to the differential pressure. According to one aspect, a Rack Liquid Infrastructure Controller (RLIC) 942 can determine that one filter 937 is clogged if the differential pressure received from differential pressure sensor 944 falls below a pre-determined value.

In one or more embodiments, RIHS 900 can provide hot-pluggable server-level liquid cooling, an integrated leak collection and detection trough, and an automatic emergency shut-off circuit. At a block level, RIHS 900 can provide embedded air-to-liquid heat exchange, and dynamic liquid flow control. At a rack level, RIHS 900 can provide facility-direct coolant delivery, a scalable rack fluid network, a rack filtration unit, and automated rack flow balancing, and a service mode.

According to one embodiment, liquid rail 924 includes a series of secondary conduits, such as supply divert conduit 997 and return divert conduit 998 that provides a by-pass fluid path for each of MLD conduits 978. In operation, divert conduit 997 allows for the removal of corresponding MLD conduit 978, thus removing the flow of cooling liquid to the particular block of nodes, without interrupting the flow of cooling liquid to the other surrounding blocks of computer gear. For example, a particular MLD conduit 978 can be replaced due to a leak. For another example, a block liquid manifold 989 can be replaced. The inclusion of divert conduits 997, 998 thus enables rapid servicing and maintenance of block liquid manifold 989 and/or nodes within block chassis without having to reconfigure the MLD conduits 978. In addition, the RIHS 900 can continue operating as cooling liquid continues to be provided to the remainder of the blocks that are plugged into the liquid rail. Re-insertion of the MLD conduit 978 then reconnects the flow of cooling liquid to the block for normal cooling operations, and shuts off the diverted flow of cooling liquid. In an exemplary embodiment, the MLD conduits 978 provide a quick disconnect feature that interrupts flow when not fully engaged to a respective port 917, 919, 921, 923. Disconnection of an MLD conduit 978 interrupts flow in a primary portion of the liquid rail 924 for either supply or return, shifting flow through one or more divert conduits 997 to provide cooling liquid to the other block liquid manifolds 989. In one or more embodiments, a manual or active shutoff valve can interrupt flow on either or both of the primary or divert portions of the liquid rail 924.

Figure 9B:
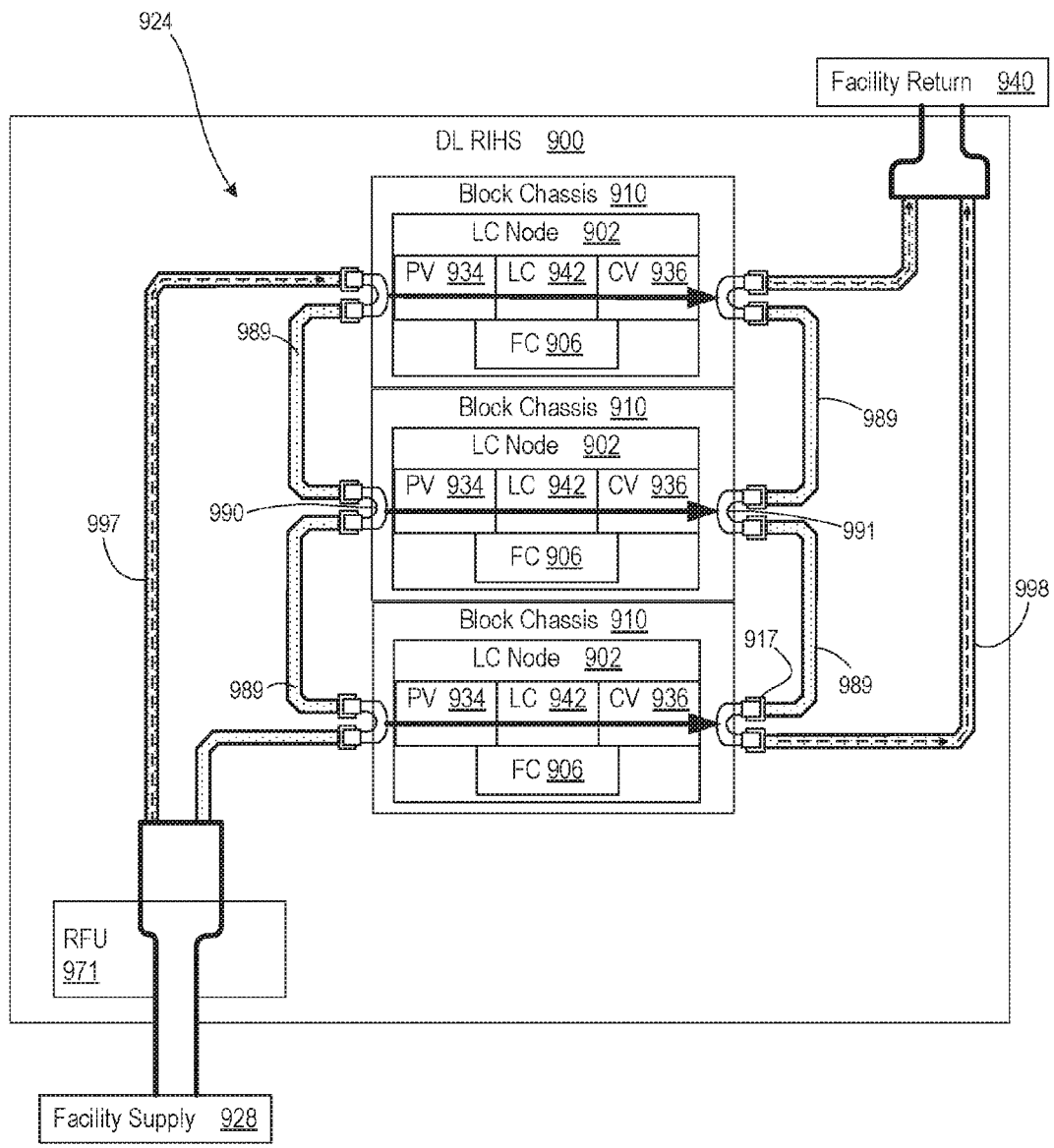
FIG. 9B illustrates a functional block diagram of an example DL RIHS having three LC nodes cooled by a liquid rail of MLD conduits and supply and return divert conduits, according to one or more embodiments.
Figure 9C:
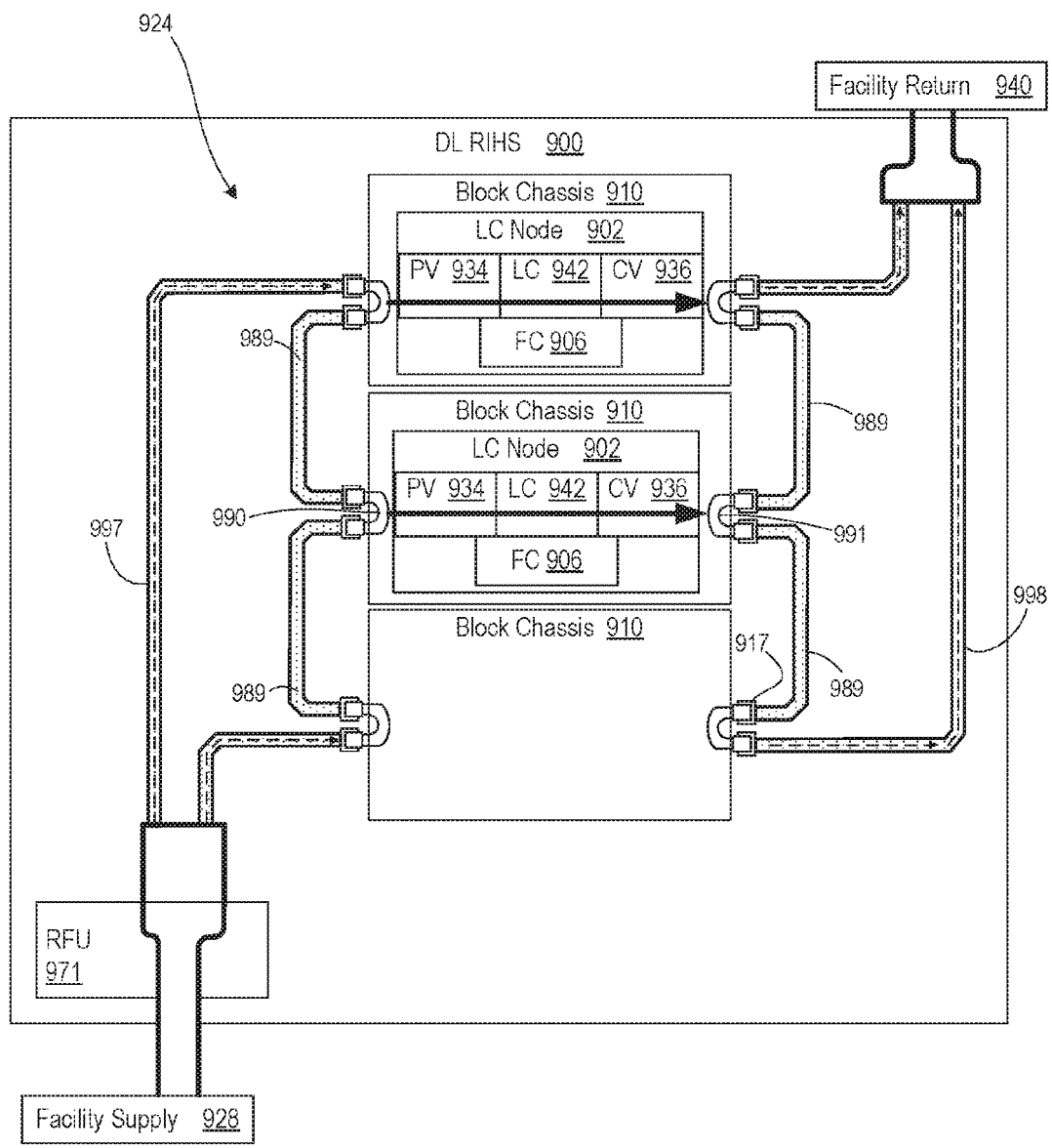
FIG. 9C illustrates a functional block diagram of the example DL RIHS of FIG. 9B having an LC node removed, according to one or more embodiments.
Figure 9D:
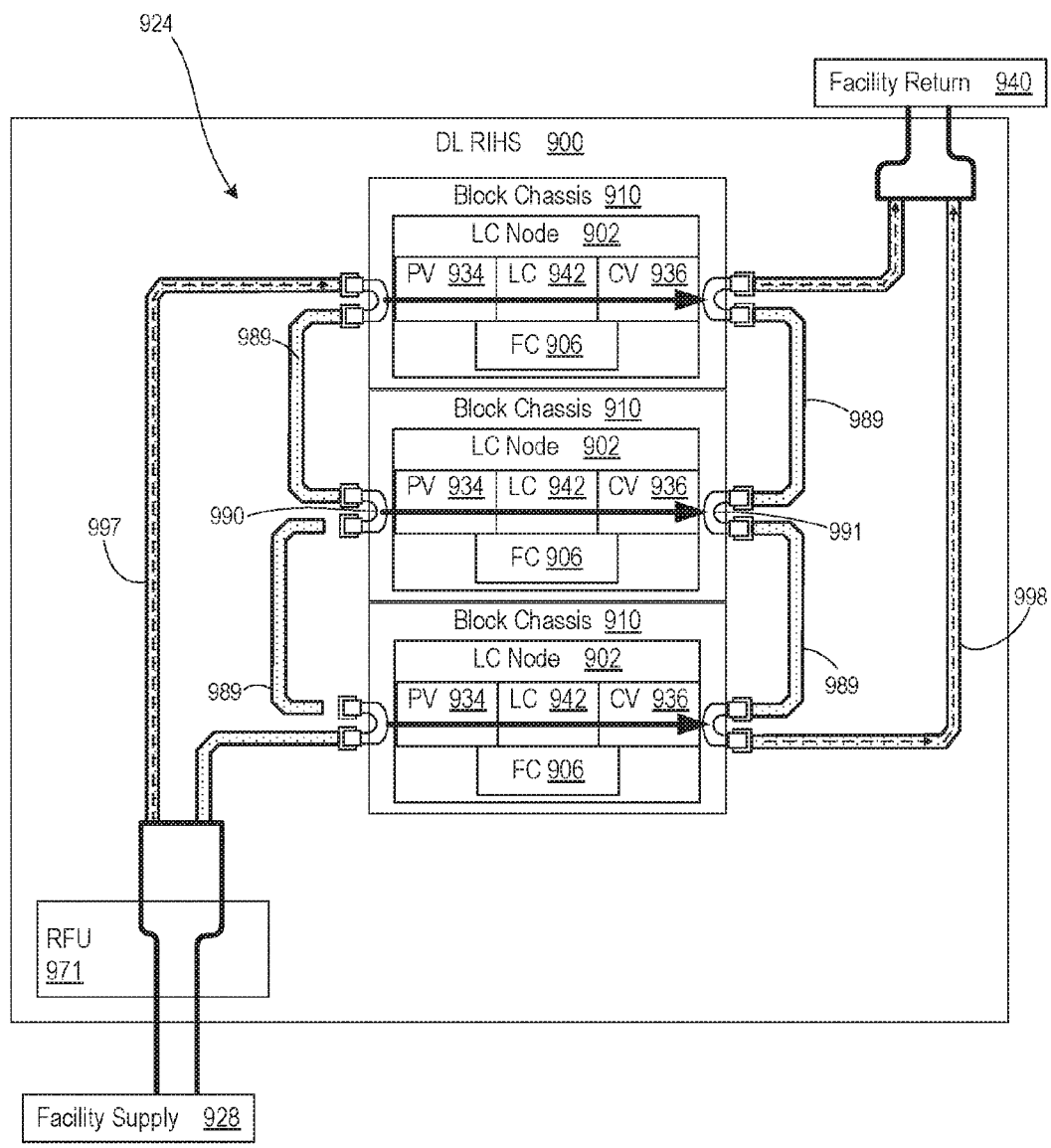
FIG. 9D illustrates a functional block diagram of the example of DL RIHS of FIG. 9B with a supply and a return MLD conduit removed, according to one or more embodiments.
Figure 9E:
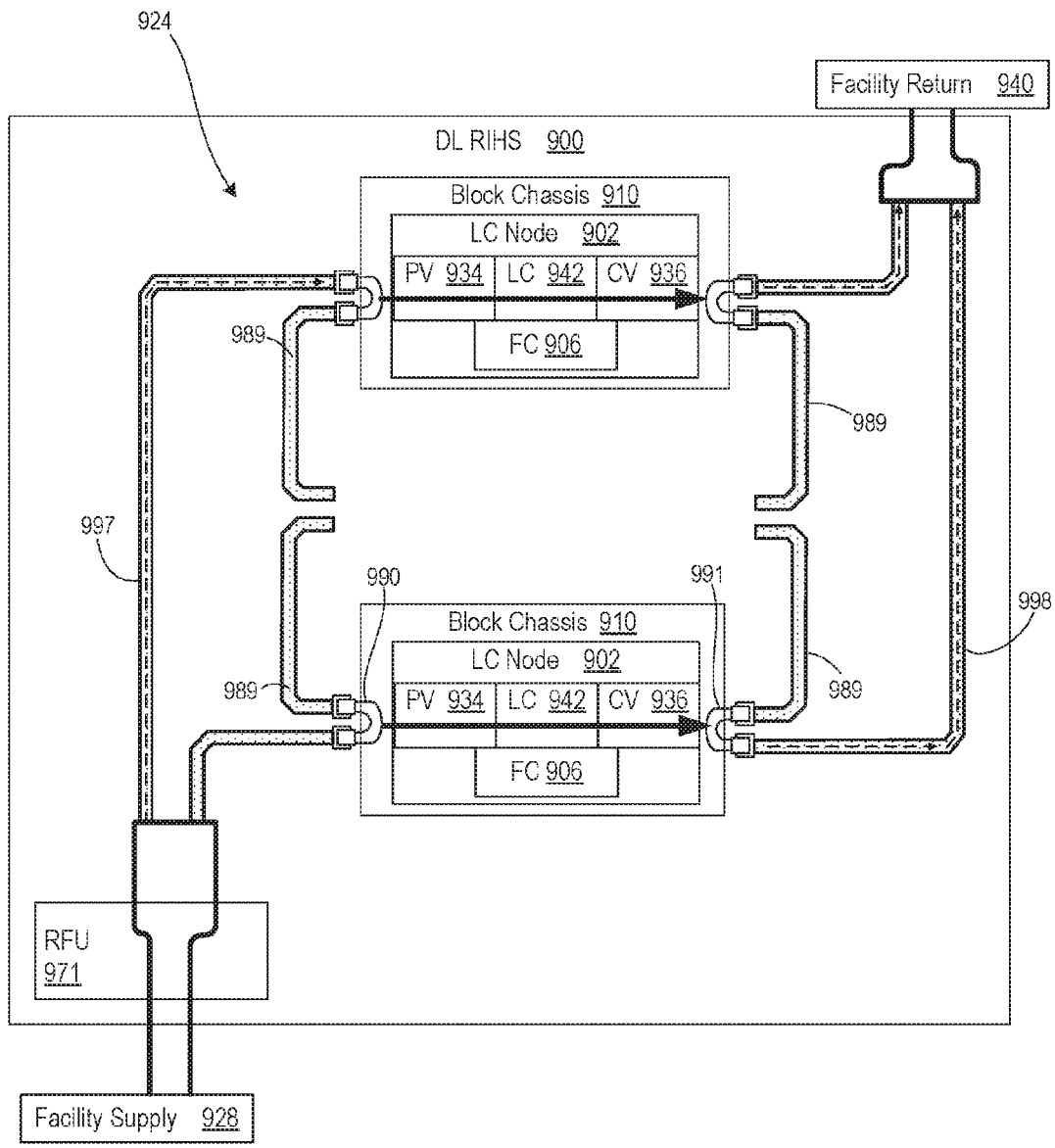
FIG. 9E illustrates a functional block diagram of the example of DL RIHS of FIG. 9B with a block chassis and LC node removed, according to one or more embodiments.

FIG. 9B illustrates the DL RIHS 900 having three block chasses 910, each having a block liquid manifold 989 represented by a supply bypass tube 990 and a return bypass tube 991. For clarity, a single LC node 902 is received in a respective block chassis 910. A dynamic control valve, such as a proportional valve (PV) 934, controls an amount of cooling liquid flow that is directed through an LC heat-exchange component 942 to cool a functional component (FC) 906. The warmed cooling liquid flow passes through a check valve (CV) 936 to join a bypass flow in the respective return bypass tube 991 A LC subsystem 920 provides the cooling liquid flow. Supply and divert conduits 997, 998 are not required to handle the flow in this nominal case with a complete liquid rail 924. FIG. 9C illustrates one LC node 920 removed. The empty block chassis 910 provides routine bypass flow through the supply and return bypass tubes 990, 991 as part of the primary flow path. the supply and divert conduits 997, 998 are not required to handle the flow in a secondary path. FIG. 9D illustrates a supply MLD conduit 989 and a return MLD conduit 989 removed for replacement. The primary flow path is interrupted by removal of the MLD conduits 989. The supply and return divert conduits 997, 998 provide a secondary flow path to block chasses 910 that are downstream of the removed MLD conduits 989. The LC node 920 that remains in the affected block chassis 910 continues to receive cooling liquid and can continue full operation. FIG. 9E illustrates removal of a block chassis 910. The supply and return divert conduits 997, 998 provide a secondary flow path to provide cooling liquid flow to the remaining block chasses 910.

Figure 10:
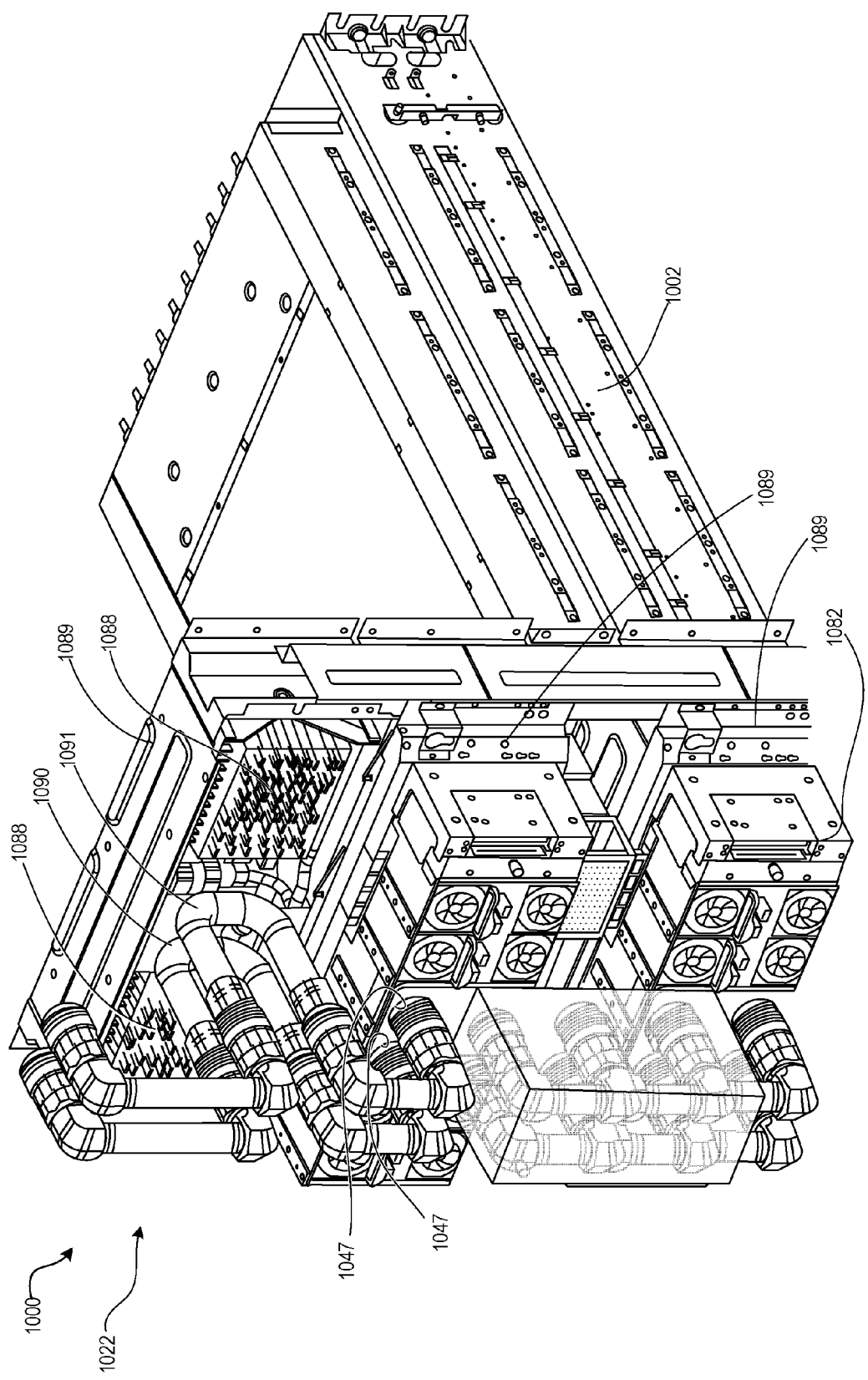
FIG. 10 illustrates a perspective view of a portion of a DL RIHS depicting example nodes, block radiators with Air-Liquid heat exchangers, and MLD conduits, according to one or more embodiments.

FIG. 10 illustrates a more detailed view of the internal makeup of the rails and other functional components of the cooling subsystem 1022 of example RIHS 1000. According to one embodiment, cooling subsystem 1022 also includes air movers and/or other devices to provide for forced air cooling in addition to the direct injection liquid cooling. As shown by FIG. 10, at least one fan module 1082 is rear mounted to a block liquid manifold 1089 in which an air-to-liquid heat exchanger (or radiator) 1088 is incorporated. The fan module 1082 provides air movement through the chassis 1010 and/or node enclosure 1008 of the node 1002 as well as through the air-to-liquid heat exchanger 1088. Each block liquid manifold 1089 includes a supply bypass tube 1090 and a return bypass tube 1091 through which a dynamically determined amount of cooling liquid is directed into the respective node 1002 while allowing a bypass flow to proceed to the next node/s 1002 in fluid path of the intake flow. Fan module 1082 includes apertures 1047 through which the supply and return bypass tubes 1090, 1091 are extended, in one embodiment. Nodes 1002 are connected into the back side of the block liquid manifold with the ends of intake and exhaust liquid transfer conduits in sealed fluid connection with bypass tubes 1090 and 1091 respectively.

Figure 11:
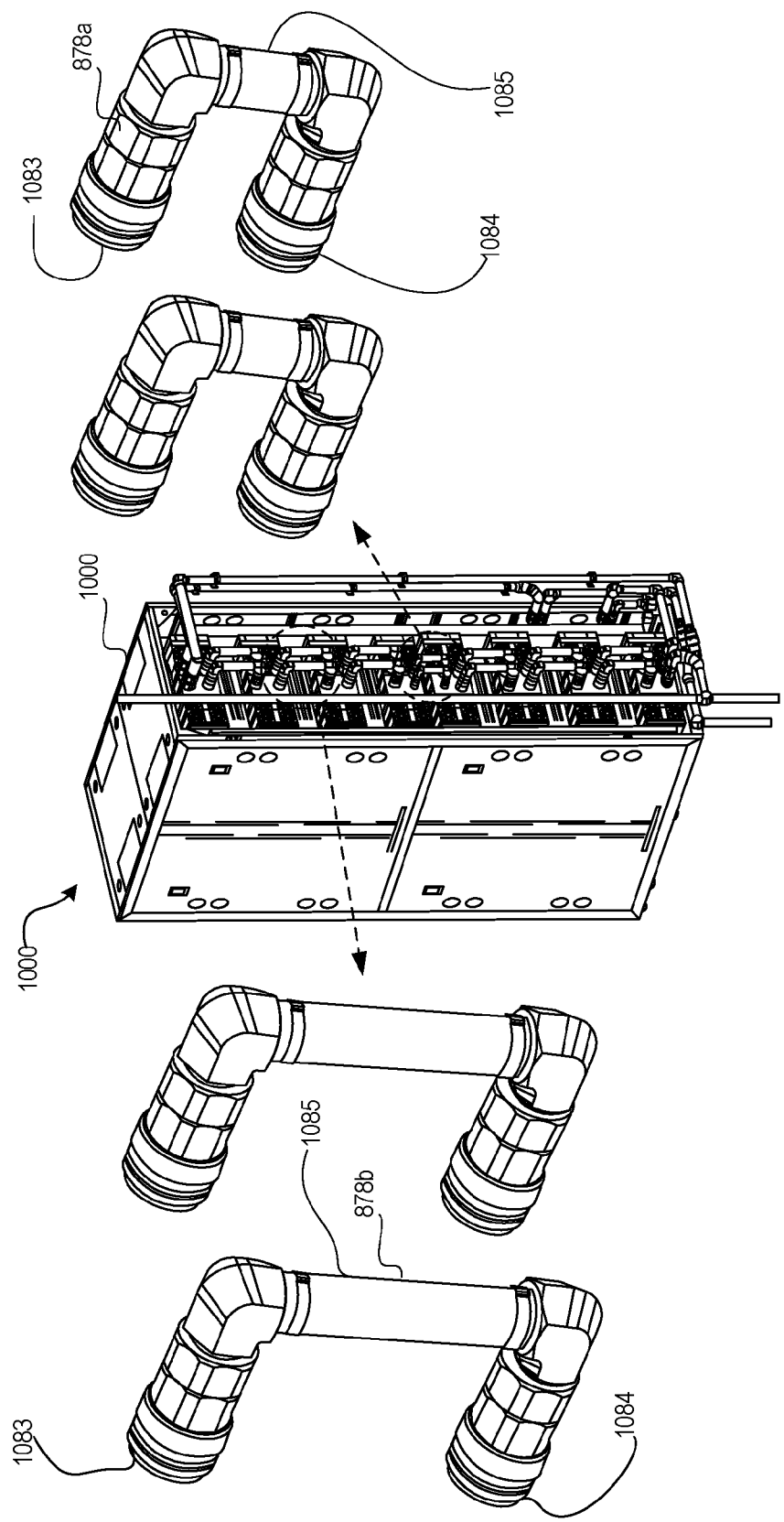
FIG. 11 illustrates a rear perspective view of the example RIHS of FIG. 5 with an exploded detail view of MLD conduits, according to one or more embodiments.
Figure 12:
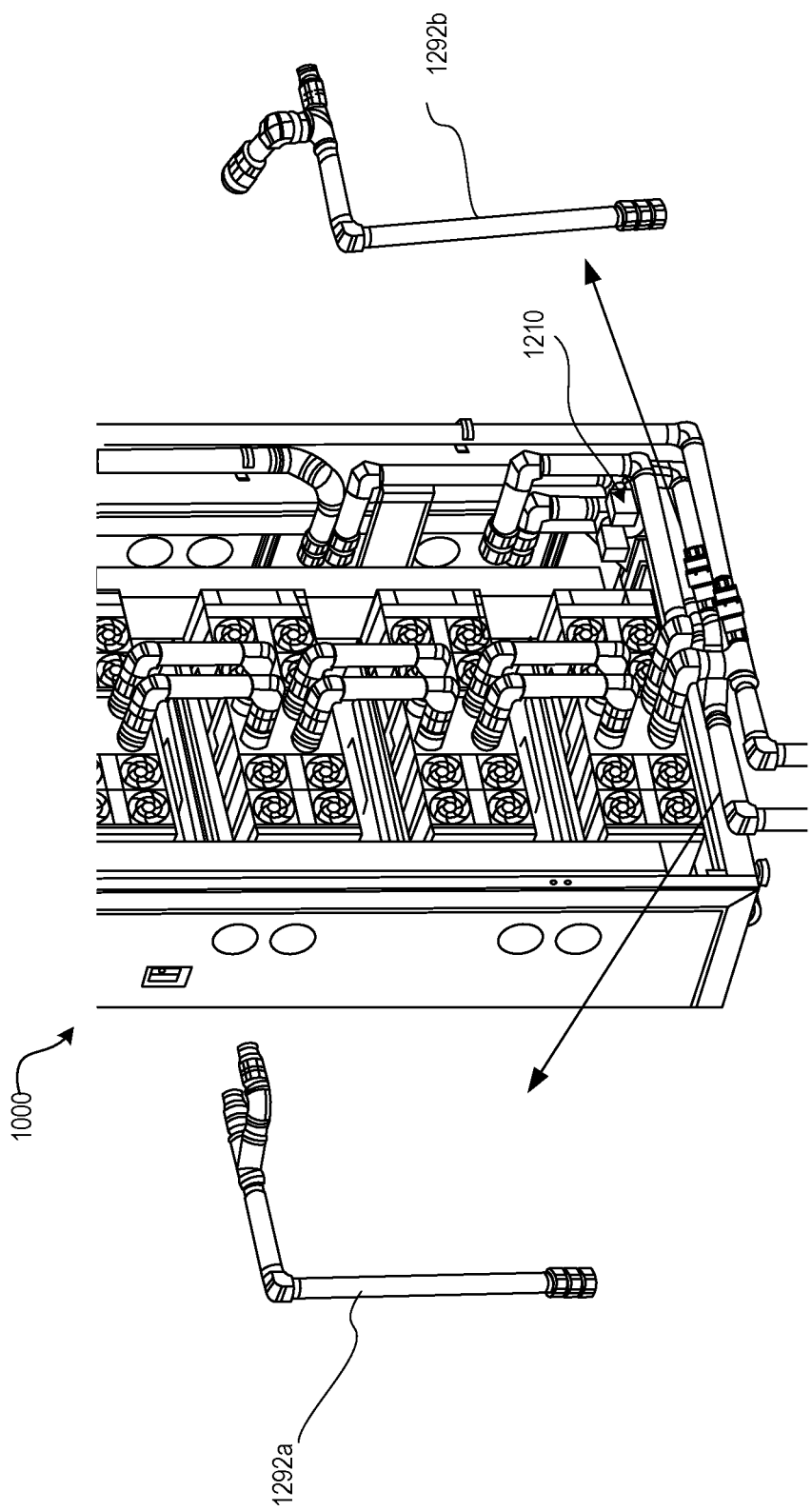
FIG. 12 illustrates a rear perspective view of the example RIHS of FIG. 5 with an exploded detail view of example bottom-feed facility supply conduits and return MLD conduits, according to one or more embodiments.

FIG. 11 illustrates the example DL RIHS 1000 with MLD conduits 878 *a*-878*b* (of FIG. 8) of two different multiples of rack units in dimension, according to one or more embodiments. Terminal connections 1083, 1084 with connecting central conduit 1085 can be formed from hose materials with molded perpendicular bends. FIG. 12 illustrates the example RIHS 1000 including bottom-feed facility supply and return MLD conduits 1292*a*, 1292*b*, according to one or more embodiments. FIG. 12 also illustrates two service buttons 1210 located at the back-lower portion of the rack. Service buttons 1210 are located on and/or in communication with RFU 102*k* (FIG. 1), features of which are presented in greater detail in FIGS. 13A-13B. Service buttons 1210 enable manual triggering of a service mode of DL RIHS, that allows for removal and re-insertion of one or more nodes and/or other components plugged into the fluid rail without experiencing a significant amount of hydraulic force and without having to shut down the entire DL RIHS to implement the service of one component.

Figure 13A:
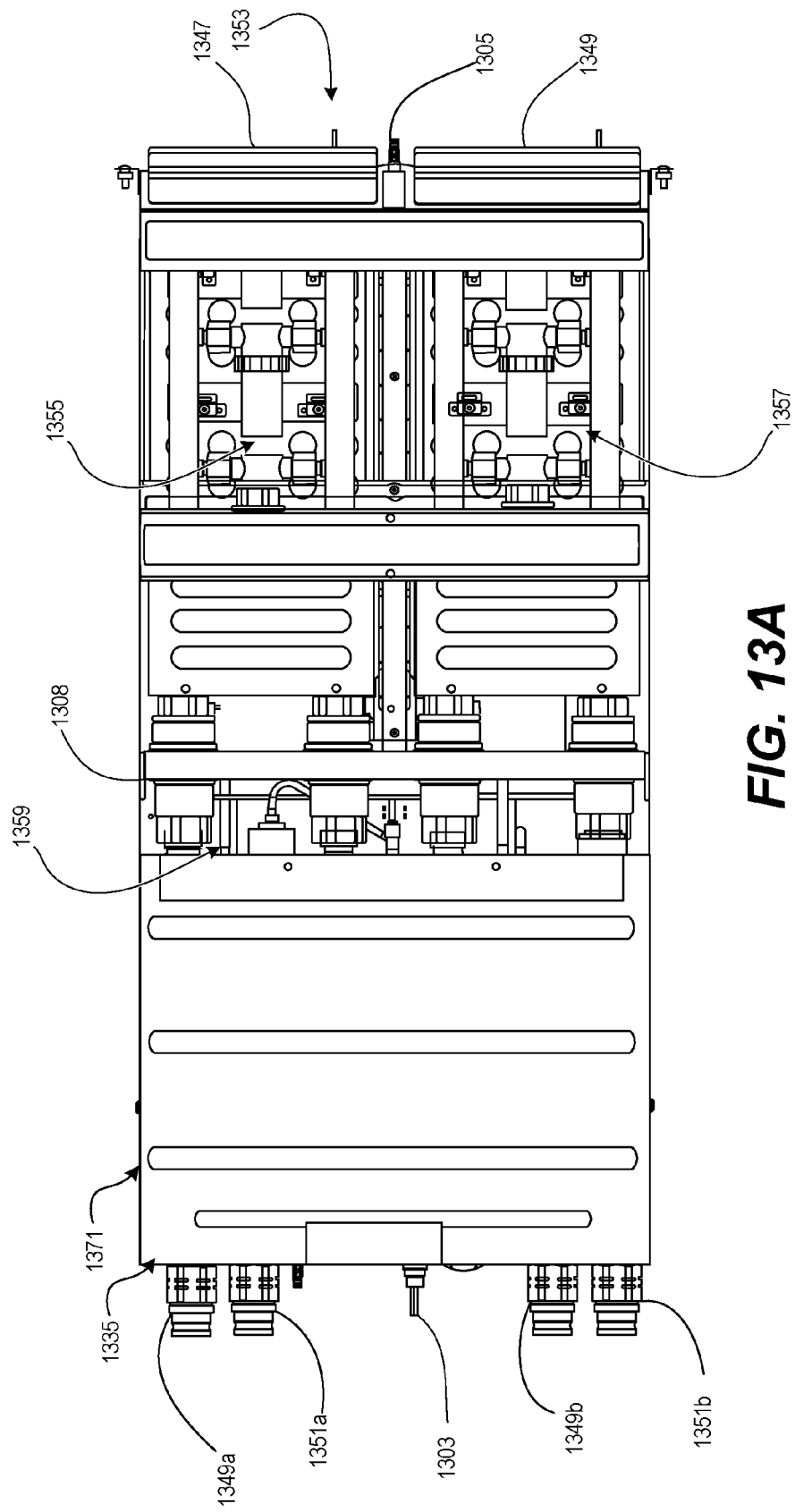
FIG. 13A illustrates a top view of a rack filtration unit (RFU) of the example cooling subsystem, according to one or more embodiments.
Figure 13B:
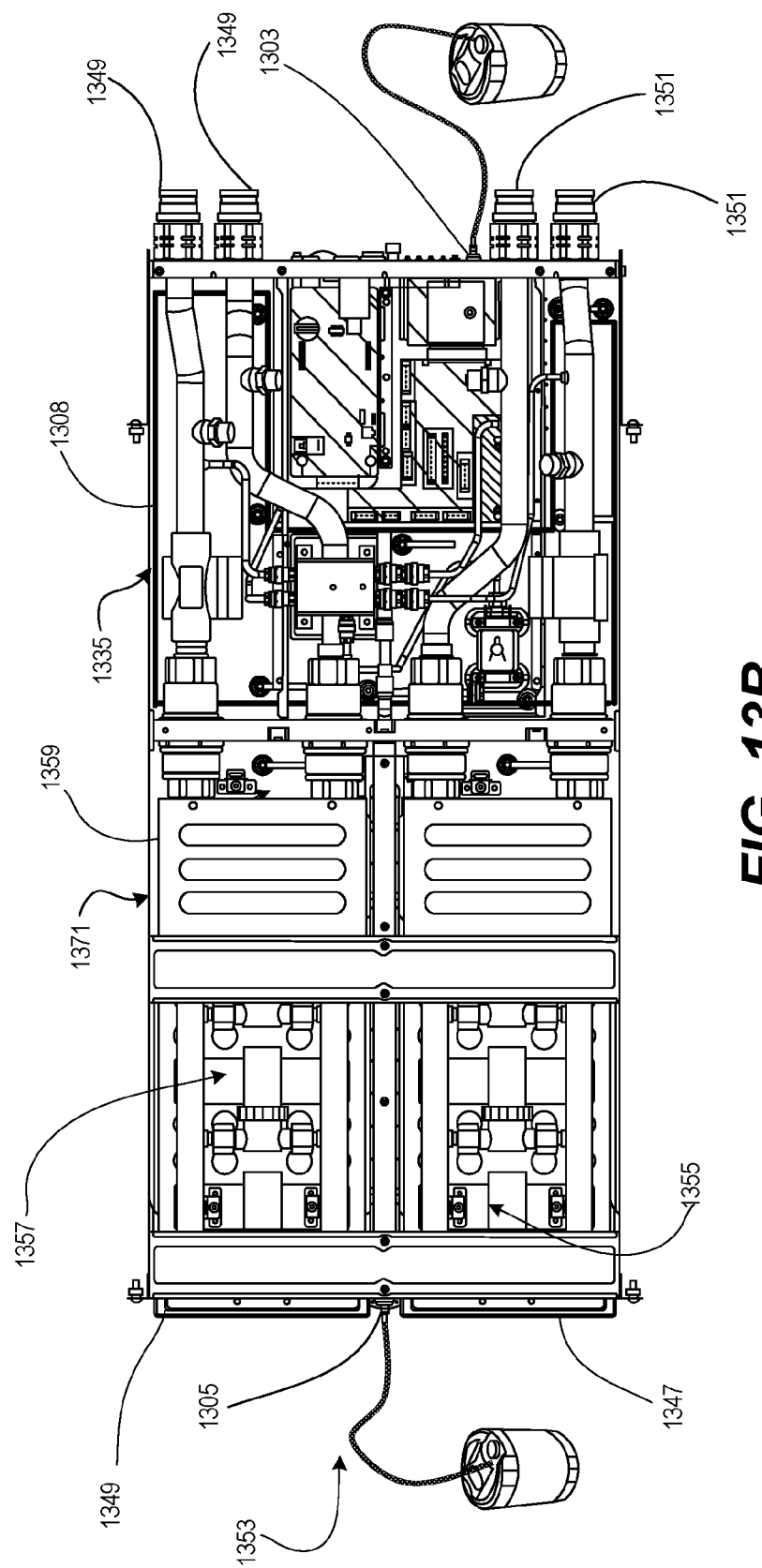
FIG. 13B illustrates a bottom view of the RFU of the example cooling subsystem of FIG. 13A, according to one or more embodiments.

FIGS. 13A-13B illustrate additional structural details of hot pluggable RFU 1371, which includes filters for filtering out contaminants in order to protect the liquid transfer conduits from clogging and/or chemical deterioration. RFU 1371 includes a front air purging connection 1303 for temporary bleeding of pressure for filter tray installation. RFU 1371 includes a rear air purging connection 1305 for temporary bleeding of pressure for block liquid interconnect installation. RFU 1371 includes hot-pluggable filter drawer 1311 and drawer 1313 that are plumbed in parallel for continued operation during servicing of drawer 1311 or drawer 1313. RFU 1371 includes node chassis 1308 insertable into a rack of an RIHS. At least one node supply port 1349 and at least one node return port 1351 are positioned on an inserted side 1353 of the node chassis 1308 to seal for fluid transfer respectively to a facility liquid supply conduit and a rail supply conduit of the liquid rail of a liquid cooling system for the RIHS. First filtration subunit 1355 and second filtration subunit 1357 are housed in hot-pluggable filter drawer 1311 and drawer 1313, which are connected in parallel fluid communication within node chassis 1308. Each filtration subunit 1355 and filtration subunit 1357 is individually disengageable from node chassis 1308 for maintenance or replacement, while the other filtration subunit 1355 or filtration subunit 1357 remains engaged in the node chassis and continues liquid filtration. A liquid coolant diversion network 1359 diverts liquid flow to the other filtration unit 1355 or filtration unit 1357 for continuous filtration of contaminants and/or particulates from the cooling liquid received from the supply side, when one filtration unit 1355 or filtration unit 1357 is removed.

FIG. 13B illustrates purge check valves 1359 that prevent liquid short circuit through purge solenoid valve 1310 of RFU 1371. In an exemplary embodiment, dual node supply ports 1349*a*, 1349*b* and dual node return port 1351*a*, 1351*b* support two independent feeds with external solenoids that are powered and/or controlled from RFU 1371 for filter drawers 1311, 1313, respectively. According to one aspect, purge solenoid valve 1310 is triggered by a rack liquid infrastructure controller (RLIC) or other service mode controller to open and dispense a specific amount of liquid from within the liquid cooling system of conduits to reduce the overall pressure of liquid within the system. In one embodiment, the amount of liquid released by purge solenoid valve 1310 can be variable based on the pressure within the system of conduits as measured by one or more liquid pressure sensors (not specifically shown). RFU 1371 includes a differential pressure sensor that measures a pressure drop across a filter and provides an electrical signal proportional to the differential pressure. According to one aspect, the RLIC can determine that the filter is clogged if the differential pressure received from differential pressure sensor 1184C falls below a pre-determined value.

Figure 14:
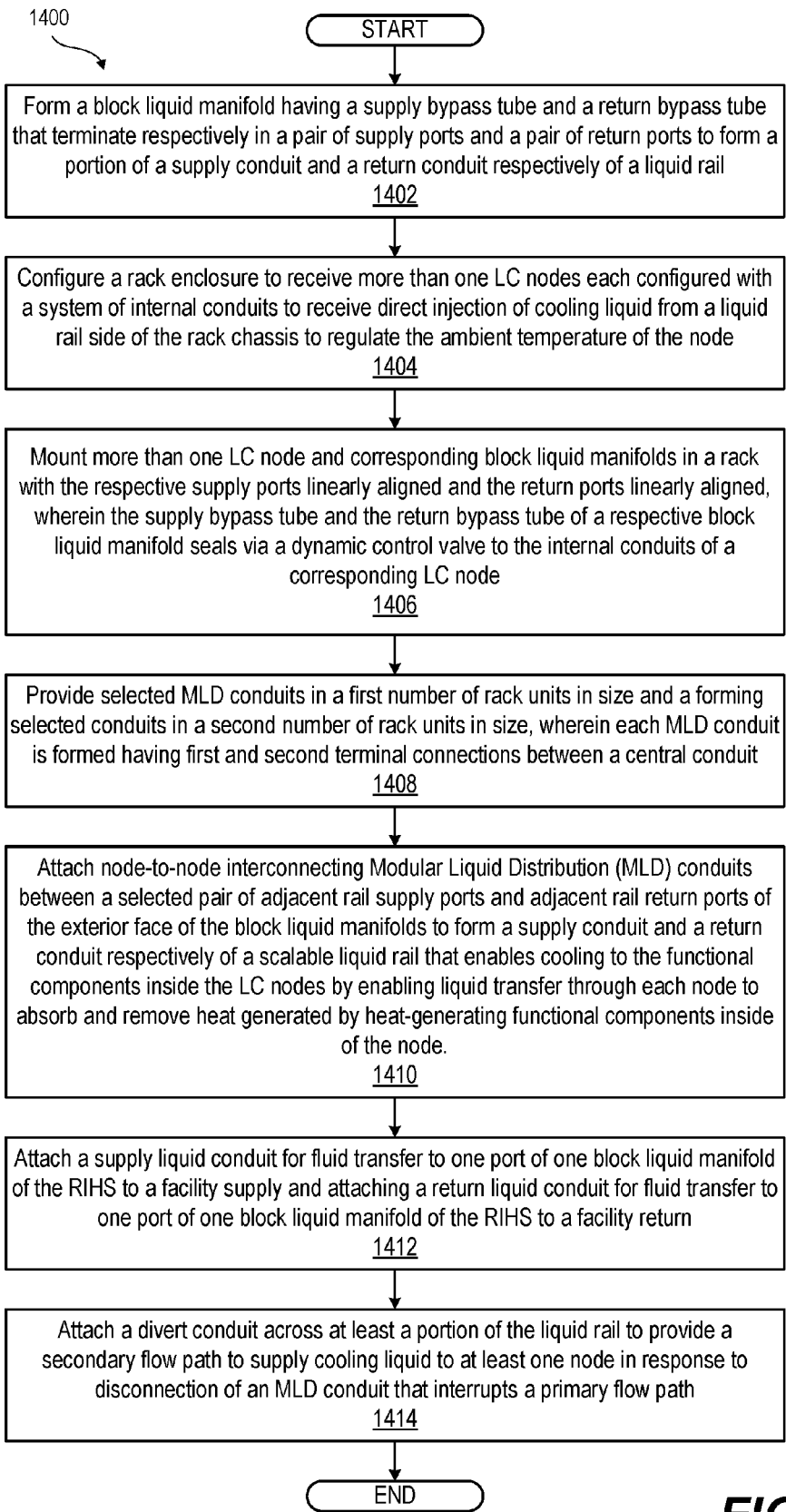
FIG. 14 illustrates a flow diagram of a method of assembling a DL RIHS using MLD conduits, according to one or more embodiments.

FIG. 14 illustrates a method 1400 of assembling a DL RIHS, such as one of RIHS 100, 800, 900, and/or 1000. In one or more embodiments, method 1400 includes forming a block liquid manifold having a supply bypass tube and a return bypass tube that terminate respectively in a pair of supply ports and a pair of return ports to form a portion of a supply conduit and a return conduit respectively of a liquid rail (block 1402). The method includes configuring a rack enclosure to receive more than one LC nodes each configured with a system of internal conduits to receive direct injection of cooling liquid from a liquid rail side of the rack chassis to regulate the ambient temperature of the node (block 1404). The method 1400 includes mounting more than one LC node and corresponding block liquid manifolds in a rack with the respective supply ports linearly aligned and the return ports linearly aligned, wherein the supply bypass tube and the return bypass tube of a respective block liquid manifold seals via a dynamic control valve to the internal conduits of a corresponding LC node (block 1406). The method 1400 optionally includes providing selected MLD conduits in a first number of rack units in size that can correspond to the block chassis size and a forming selected conduits in a second number of rack units in size, where each MLD conduit is formed having first and second terminal connections between a central conduit (block 1408). In one embodiment, the MLD conduits are purchased in correct dimensions from a third party supplier. The method 1300 includes attaching node-to-node interconnecting MLD conduits between a selected pair of adjacent rail supply ports and adjacent rail return ports of the exterior face of the block liquid manifolds to form a supply conduit and a return conduit respectively of a scalable liquid rail that enables cooling to the functional components inside the LC nodes by enabling liquid transfer through each node to absorb and remove heat generated by heat-generating functional components inside of the node (block 1410). The method further includes attaching bypass conduits across the chasses to allow for continued flow of cooling liquid to the remaining blocks in the RIHS following removal of one or more of the MLD conduits serving specific blocks along the rail. Removal of MLD conduits for a specific block chassis can occur during servicing of one or more nodes in that particular block, as one example. The bypass conduits also allow the facility supply and return to be able to connect in a reverse configuration, where the direction of liquid flow is reversed. The method 1400 includes optionally attaching a supply liquid conduit for fluid transfer to one port of one block liquid manifold of the RIHS to a facility supply and attaching a return liquid conduit for fluid transfer to one port of one block liquid manifold of the RIHS to a facility return (block 1412). Then method 1400 ends.

Figure 15:
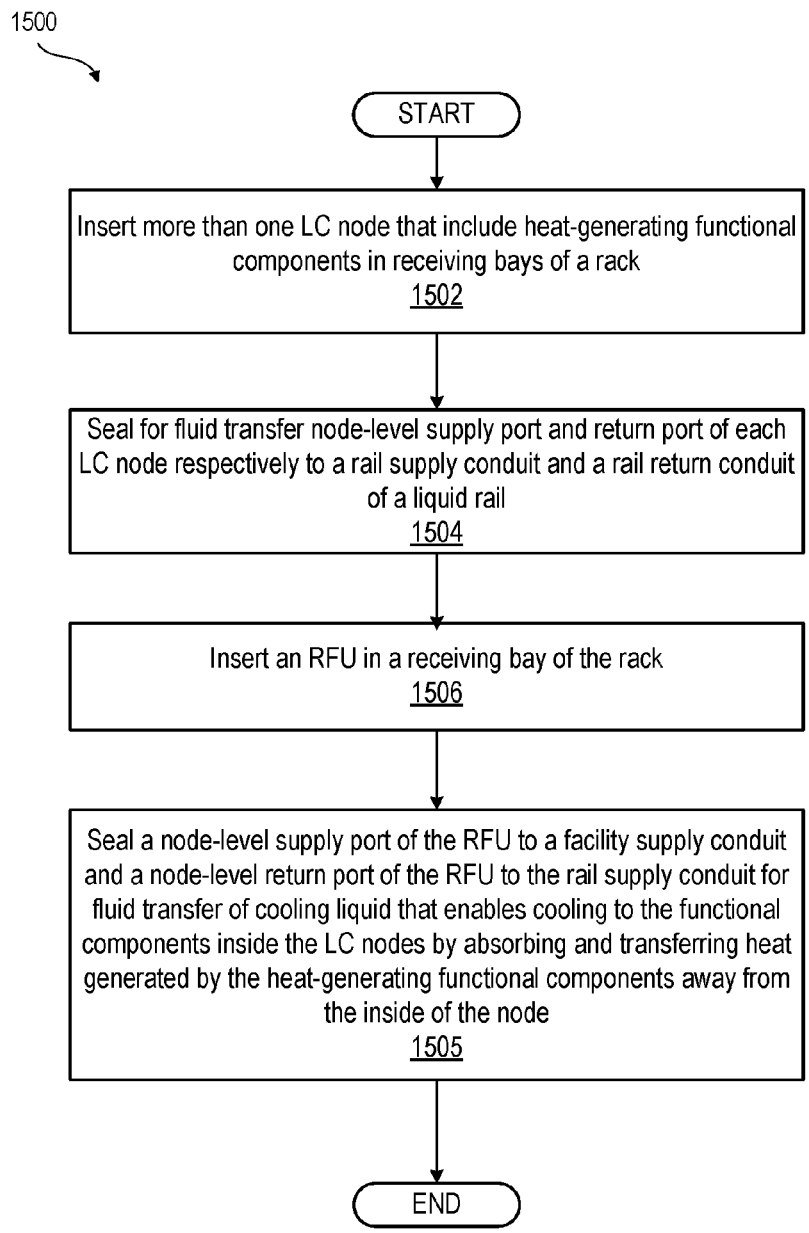
FIG. 15 illustrates a flow diagram of a method of using a liquid rack for Direct-interface liquid cooling of the DL RIHS, according to one or more embodiments.

FIG. 15 illustrates a method of providing direct-interface liquid cooling of an RIHS. In one or more embodiments, the method 1500 includes selecting one of a facility supply and return and a closed loop pumped configuration to move cooling liquid through a liquid rail of an RIHS (block 1502). The method 1500 includes sensing a temperature of one or more of: a heat-generating functional component in an LC node, an air temperature within a rack in which the LC node is mounted, an ambient temperature outside of the RIHS, and a temperature of the cooling liquid (block 1504). The method 1500 includes filtering the supplied cooling liquid using first and second filtration subunits of the RFU (block 1506). The method 1500 includes detecting when one of the filtration units is removed from the liquid supply (block 1508), and in response to that detection, diverting all of the cooling liquid to filter through the first filtration subunit to enable continued filtration, while the second filtration unit is removed and/or replaced (block 1510). The method 1500 includes dynamically controlling a node-level supply valve to divert a portion of the cooling liquid flowing through a supply conduit of the liquid rail through an embedded heat exchange manifold attached in proximity to the heating-generating functional components in response to the sensed temperature (block 1512). The method 1500 includes routing the returned cooling liquid through an air-liquid heat exchanger of a block liquid manifold to cool one of the forced cooling air and the cooling liquid before returning the cooling liquid to a return conduit of the liquid rail (block 1514). Then method 1500 ends.

In the above described flow charts of FIGS. 14-15, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A Rack Information Handling System (RIHS) comprising:
   a rack having chassis-receiving bays;
   more than one liquid cooled (LC) node each comprising a chassis received in a respective chassis-receiving bay of the rack and containing heat-generating functional components, each LC node configured with a system of conduits to receive direct injection of cooling liquid to regulate the ambient temperature of the node and provide cooling to the functional components inside the node by removing heat generated by the heat-generating functional components;
   a cooling subsystem having a liquid rail formed by more than one node-to-node, Modular Liquid Distribution (MLD) conduit between LC nodes provisioned in the rack and comprising first and second terminal fluid connections attached on opposite ends of a central conduit to seal to and enable fluid transfer between a port of a selected LC node and a port of another adjacent node; and
   a plurality of block liquid manifolds mountable at a back of a rack, where each block liquid manifold has two supply ports and two rail return ports on an outside facing side of the block liquid manifold that respectively communicate with at least one manifold supply port and a manifold return port on an inside facing side of the block liquid manifold, wherein the more than one LC nodes are insertably placed in receiving bays of the rack corresponding to locations of the mounted block liquid manifolds, with block supply ports and block return ports of the LC nodes and an inside facing portion of the corresponding block liquid manifold linearly aligned, and sealing, for fluid transfer, the block supply and return ports of a selected one or more LC nodes to the linearly aligned manifold supply and return ports of the inside facing portion of the block liquid manifold, each block liquid manifold comprising a supply bypass tube that communicates a bypass supply flow between the two rail supply ports with a node-selected portion of the bypass supply flow diverted from the manifold supply port to the block supply port, each block liquid manifold comprising a return bypass tube that communicates a bypass return flow between the two rail return ports with the node-selected portion of the bypass supply flow diverted after routing through the respective LC node from the block return port to the manifold supply port.

2. The RIHS of claim 1, wherein the MLD conduits are provided in rack-unit dimensions to selectively support LC nodes of selected rack-unit vertical heights.

3. The RIHS of claim 1, wherein:
   the first and second liquids ports of the supply bypass tubes are linearly aligned; and
   the first and second liquid ports of the return bypass tubes are linearly aligned.

4. The RIHS of claim 1, wherein the node liquid manifold comprises an air-liquid heat exchanger that receives liquid flow from the liquid rail that transfers heat from airflow through the attached LC node into the liquid flow.

5. The RIHS of claim 1, further comprising:
   a modular liquid supply component attachable between a selected port of a supply bypass tube of the liquid rail and a liquid supply; and
   a modular liquid return component attachable between a selected port of a return bypass tube of the liquid rail and a liquid return.

6. The RIHS of claim 1, wherein the MLD conduits form a closed loop between a supply side and return side of the liquid rail, the RIHS further comprising a fluid mover to create a fluid flow through the closed loop.

7. The RIHS of claim 1, further comprising a fan module attachable to the block liquid manifold and comprising one or more air movers positioned to move air through the air-liquid heat exchanger and comprising an opening to expose the first and second ports of the supply and return bypass tubes to enable assembly with the block liquid manifold.

8. The RIHS of claim 1, wherein the liquid rail comprises a divert conduit connected for a secondary flow path across at least a portion of the liquid rail to supply cooling liquid to at least one node in response to disconnection of an MLD conduit that interrupts a primary flow path.

9. A cooling subsystem of a direct-interface liquid-cooled (DL) Rack Information Handling System (RIHS), the cooling subsystem comprising:
   a liquid rail formed by more than one node-to-node, Modular Liquid Distribution (MLD) conduit between more than one liquid cooled (LC) node provisioned in a rack and comprising:
   first and second terminal fluid connections attached on opposite ends of a central conduit to seal to and enable fluid transfer between a port of a selected LC node and a port of an adjacent LC node,
   wherein each LC node comprising a chassis received in a respective chassis-receiving bay of the rack and containing heat-generating functional components, each LC node configured with a system of conduits to receive direct injection of cooling liquid to regulate the ambient temperature of the node and provide cooling to the functional components inside the node by absorbing and removing heat generated by the heat-generating functional components inside of the LC node; and
   a plurality of block liquid manifolds mountable at a back of a rack, where each block liquid manifold has two supply ports and two rail return ports on an outside facing side of the block liquid manifold that respectively communicate with at least one manifold supply port and a manifold return port on an inside facing side of the block liquid manifold, wherein the more than one LC nodes are insertably placed in receiving bays of the rack corresponding to locations of the mounted block liquid manifolds, with block supply ports and block return ports of the LC nodes and an inside facing portion of the corresponding block liquid manifold linearly aligned, and sealing, for fluid transfer, the block supply and return ports of a selected one or more LC nodes to the linearly aligned manifold supply and return ports of the inside facing portion of the block liquid manifold, each block liquid manifold comprising a supply bypass tube that communicates a bypass supply flow between the two rail supply ports with a node-selected portion of the bypass supply flow diverted from the manifold supply port to the block supply port, each block liquid manifold comprising a return bypass tube that communicates a bypass return flow between the two rail return ports with the node-selected portion of the bypass supply flow diverted after routing through the respective LC node from the block return port to the manifold supply port.

10. The cooling subsystem of claim 9, wherein the MLD conduits are provided in rack-unit dimensions to selectly support LC nodes of selected rack-unit vertical heights.

11. The cooling subsystem of claim 9, wherein:
the first and second liquids ports of the supply bypass tubes are linearly aligned; and
the first and second liquid ports of the return bypass tubes are linearly aligned.

12. The cooling subsystem of claim 9, wherein the node liquid manifold comprises an air-liquid heat exchanger that receives fluid flow from the liquid rail that transfers heat from airflow through the attached LC node into the fluid flow.

13. The cooling subsystem of claim 9, further comprising:
a modular liquid supply component attachable between a selected port of a supply bypass tube of the liquid rail and a liquid supply; and
a modular liquid return component attachable between a selected port of a return bypass tube of the liquid rail and a liquid return.

14. The cooling subsystem of claim 9, wherein the MLD conduits form a closed loop between a supply side and return side of the liquid rail, the RIHS further comprising a fluid mover to create a fluid flow through the closed loop liquid rail.

15. The cooling subsystem of claim 9, further comprising a fan module attachable to the block liquid manifold and comprising one or more air movers positioned to move air through the air-liquid heat exchanger and comprising an opening to expose the first and second ports of the supply and return bypass tubes.

16. The cooling system of claim 9, wherein the liquid rail comprises a divert conduit connected for a secondary flow path across at least a portion of the liquid rail to supply cooling liquid to at least one node in response to disconnection of an MLD conduit that interrupts a primary flow path.

17. A method of assembling a Direct-Interface Liquid-Cooled (DL) Rack Information Handling System (RIHS), the method comprising:
mounting a plurality of block liquid manifolds at a back of rack, where each block liquid manifold has at least one rail supply port and a rail return port on an outside facing side of the block liquid manifold that respectively communicate with at least one block supply port and a block return port on an inside facing side of the block liquid manifold;
inserting more than one LC nodes in receiving bays of the rack corresponding to locations of the mounted block liquid manifolds, with the block supply ports and the block return ports of the LC nodes and an inside facing portion of the corresponding block liquid manifold linearly aligned;
sealing, for fluid transfer, the ports of a selected one or more LC nodes to the lineally aligned block supply and return ports of the inside facing portion of the block liquid manifold; and
attaching node-to-node interconnecting Modular Liquid Distribution (MLD) conduits between a selected pair of adjacent rail supply ports and adjacent rail return ports of the exterior face of the block liquid manifolds to form a supply conduit and a return conduit respectively of a scalable liquid rail that enables cooling to the functional components inside the LC nodes by enabling liquid transfer through each node to absorb and remove heat generated by heat-generating functional components inside of the node.

18. The method of claim 17, further comprising forming the block liquid manifold by:
forming a supply bypass tube and a return bypass tube that, with the MLD conduits, provides the liquid rail, each of the supply and return bypass tubes terminating in first and second ports that connect to a respective MLD conduit to form a portion of one of the supply conduits and return conduits of the liquid rail.

19. The method of claim 18, further comprising attaching a supply liquid conduit for fluid transfer to one rail supply port of one block liquid manifold of the RIHS to a facility supply and attaching a return liquid conduit for fluid transfer to one rail return port of one block liquid manifold of the RIHS to a facility return.

20. The method of claim 17, further comprising:
assembling more than one Liquid Cooled (LC) node by:
provisioning heat-generating functional components in an enclosure of an LC node that has a vertical height that is one of a plurality of multiples of rack units, and
configuring the enclosure with a system of internal conduits to receive direct injection of cooling liquid from a liquid rail side of the chassis to regulate the ambient temperature of the node;
assembling a portion of the liquid rail corresponding to a vertical location of the LC node using a selected MLD conduits having a number of rack units in height that correspond to the height of the LC node to laterally align with the supply and return ports of the LC node and an adjacent LC node.

21. The method of claim 17, further comprising: attaching a divert conduit across at least a portion of the liquid rail to provide a secondary flow path to supply cooling liquid to at least one node in response to disconnection of an MLD conduit that interrupts a primary flow path.

* * * * *

UNITED STATES PATENT AND TRADEMARK OFFICE
CERTIFICATE OF CORRECTION

PATENT NO. : 9,839,164 B2
APPLICATION NO. : 15/016226
DATED : December 5, 2017
INVENTOR(S) : Austin Michael Shelnutt et al.

It is certified that error appears in the above-identified patent and that said Letters Patent is hereby corrected as shown below:

In the Claims

At Column 23, Line 7, delete --selectly--

Signed and Sealed this
First Day of May, 2018

Andrei Iancu
*Director of the United States Patent and Trademark Office*